US007221600B2

United States Patent
Hara et al.

(10) Patent No.: US 7,221,600 B2
(45) Date of Patent: May 22, 2007

(54) ARITHMETIC CIRCUIT INTEGRATED WITH A VARIABLE RESISTANCE MEMORY ELEMENT

(75) Inventors: Masaaki Hara, Tokyo (JP); Nobumichi Okazaki, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 11/186,207

(22) Filed: Jul. 21, 2005

(65) Prior Publication Data
US 2006/0028247 A1 Feb. 9, 2006

(30) Foreign Application Priority Data
Aug. 3, 2004 (JP) .................. P2004-226970

(51) Int. Cl.
*G11C 11/21* (2006.01)
*H03K 19/20* (2006.01)

(52) U.S. Cl. .............. 365/189.08; 365/163; 365/148; 365/225.7; 326/113; 326/112; 326/104; 326/38

(58) Field of Classification Search .......... 365/189.08, 365/225.7, 148, 163, 145; 326/106, 104, 326/112, 113, 38, 41, 47; 327/525
See application file for complete search history.

(56) References Cited
U.S. PATENT DOCUMENTS 5,930,161 A * 7/1999 Sheikholeslami et al. ..... 365/49
6,094,369 A * 7/2000 Ozawa et al. ............... 365/145
6,795,338 B2 * 9/2004 Parkinson et al. .......... 365/163
7,026,841 B2 * 4/2006 Kameyama et al. ........ 326/112
7,054,190 B2 * 5/2006 Hanyu et al. ............... 365/171
2006/0092691 A1 * 5/2006 Shiimoto et al. ........... 365/158

OTHER PUBLICATIONS

Kimura et al., "Multiple-Valued Logic-in-Memory VLSI Based on Ferroelectric Capacitor Storage and Charge Addition", Proceedings of 32nd IEEE International Symposium on Multiple-Valued Logic, May 15-18, 2002, pp. 161-166.*

* cited by examiner

*Primary Examiner*—Andrew Q. Tran
(74) *Attorney, Agent, or Firm*—Wolf, Greenfield & Sacks, P.C.

(57) ABSTRACT

An arithmetic circuit is provided having a compact and high-speed logic-in-memory wherein various operations are performed. The arithmetic circuit includes a memory element having a variable resistance element R in which the state of resistance changes reversibly between the state of high resistance and the state of low resistance by applying voltages with different polarities between one electrode and the other electrode, and at least one transistor of MRD, MRS, MW1 and MW2 connected respectively to both ends of the memory element; wherein data is stored in the memory element, the operation for the external data X, W, Y1 and Y2 input through any of the transistors is performed by applying potential to each of the ends of the memory element through the transistors MRD, MRS, MW1, and MW2, and a result of the operation is output from the memory element.

2 Claims, 6 Drawing Sheets

FIG. 1
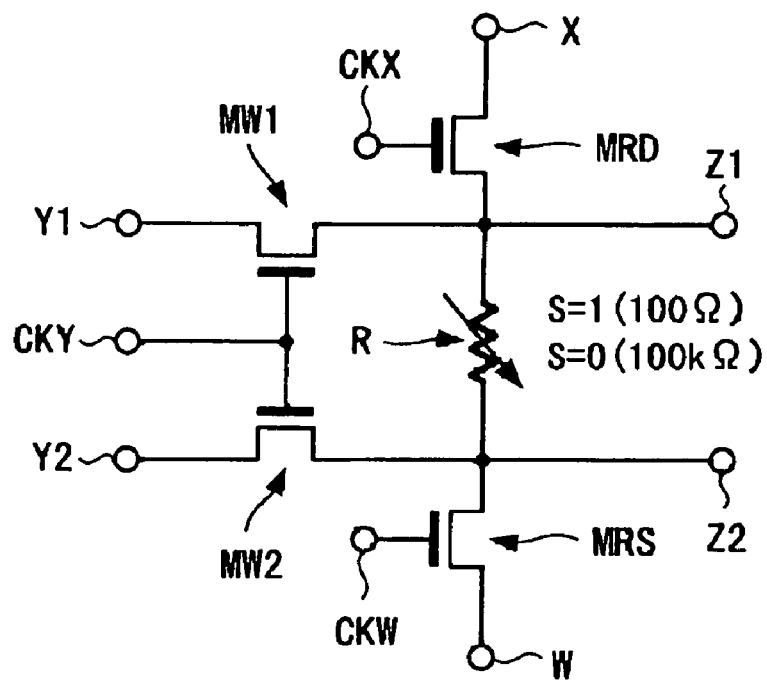
FIG. 2A
FIG. 2B
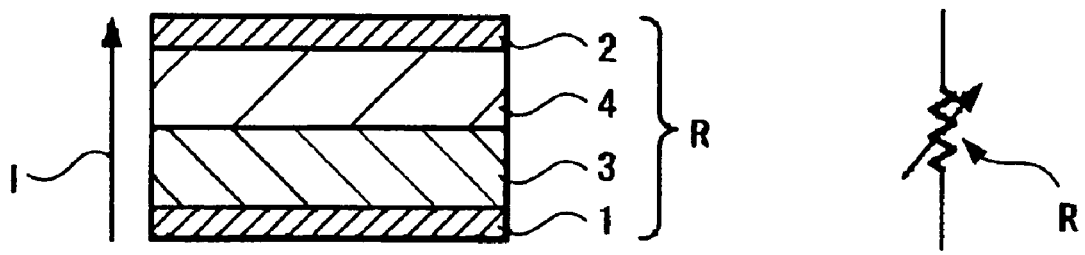

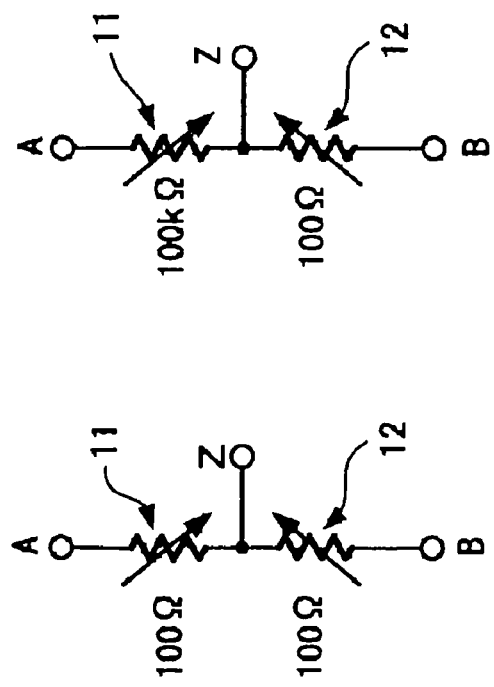
FIG. 6A  State of S=1
FIG. 6B  State of S=0
FIG. 6C  Intermediate State
FIG. 6D  Forbidden State

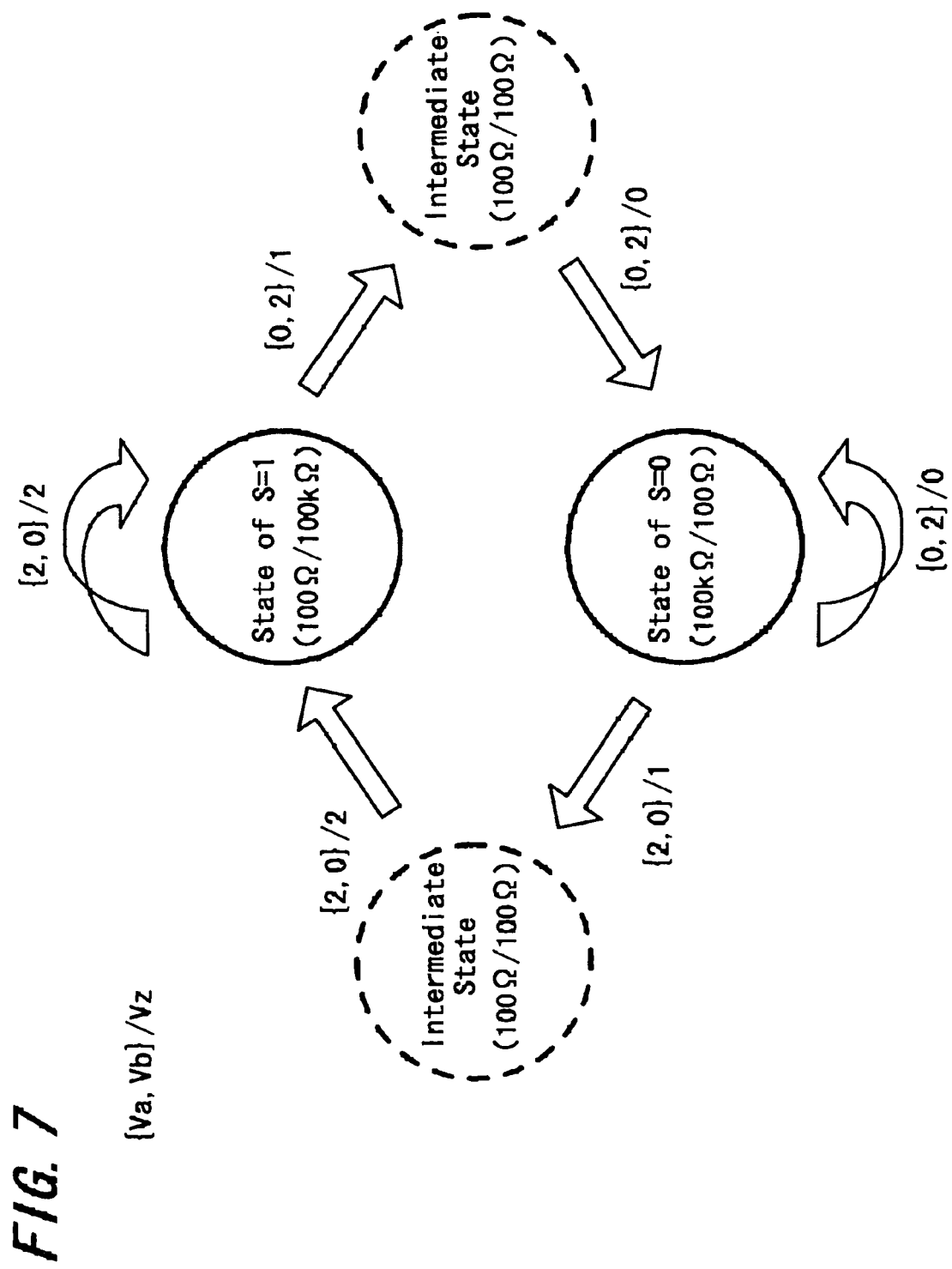

ARITHMETIC CIRCUIT INTEGRATED WITH A VARIABLE RESISTANCE MEMORY ELEMENT

CROSS REFERENCES TO RELATED APPLICATIONS

The present invention contains subject matter related to Japanese Patent Application JP 2004-226970 filed in the Japanese Patent Office on Aug. 3, 2004, the entire contents of which being incorporated herein by reference.

BACKGROUND OF THE INVENTION

1. Field of the Invention

The present invention relates to an arithmetic circuit in which an arithmetic unit and a memory are integrated.

2. Description of the Related Art

The configuration called logic-in-memory has been studied to obtain a circuit in which no information is lost even if the power is turned off and to obtain a circuit in which data transfer to separate RAM chips is not required, by constituting a logic circuit with a non-volatile device.

For example, a floating gate type MOS transistor, ferroelectric device, TMR device and the like are proposed as the non-volatile device used in the logic-in-memory (refer to Non-patent literatures 1 to 4, for example).

The logic-in-memory is the one in which an arithmetic unit and a memory which are arranged separately in current circuits are integrated. By integrating the arithmetic unit and the memory, the bottleneck of performance caused by wiring delay which is a problem in the current integrated circuit can be solved.

Further, though the circuit becomes typically large if the arithmetic function is dispersed and given to the memory, if the device including the non-volatile memory function is used, the compact and high performance circuit may be obtained.

The reason why the compact and high performance circuit is obtained is explained in the followings.

A typical digital circuit uses a configuration called a static circuit, specifically, a configuration that uses a bistable flip-flop such as a SRAM basic circuit as a memory circuit.

Because this circuit is bistable, it is suitable for high-speed operation and has a merit such that the static power consumption is low.

However, it is not suitable for high density integration because six elements constitute one bit memory.

On the other hand, if a configuration called a dynamic circuit, specifically, a configuration that uses a DRAM basic circuit as a memory circuit is employed, since two elements constitute one bit memory, there is such a merit that the circuit is suitable for high density integration.

However, because this circuit is monostable and the destructive reading is performed, pre-charging is needed for rewriting (refreshing) and for small signal amplification, which is inconvenient for the high speed operation and also which makes consuming current increase.

Thus, because the high speed operation can not be performed without refreshing processing and the like, the dynamic circuit is not typically used.

Then, if a device having the non-volatile memory function is introduced into a memory circuit, a logic circuit using the above-described dynamic circuit obtained with a fewer elements can be used without the restriction of operation, because the pre-charging for the rewriting (refreshing) and small signal amplification is not needed.

In this way, the compact and high performance logic circuit may be obtained.

Next, the configuration and operation principle of the logic circuit using this dynamic circuit are explained.

In the logic circuit using a dynamic circuit, a configuration called the FPG (Functional Pass Gate) is employed as a circuit that performs the logical operation. This FPG has a configuration including: an arithmetic element, a memory element and a pass gate transistor, where the memory data for the logical operation is stored in the memory element, and the arithmetic element performs the logical operation using this memory data, and then, the result of the logical operation by the arithmetic element is input to a gate of the pass gate transistor, and consequently the pass gate transistor is made to turn on or off in accordance with the result of operation.

In the dynamic circuit, a pass gate transistor of the FPG is connected to match lines, for example, a pre-charging transistor is provided between a match line on the side of one terminal of the pass gate transistor and a power supply voltage, and a evaluation transistor is provided between a match line on the side of the other terminal of the pass gate transistor and a ground potential. Furthermore, a pre-charging line is connected to each gate of the pre-charging transistor and evaluation transistor such that only either of the pre-charging transistor and evaluation transistor is turned on by the pre-charging line (refer to FIG. 2 and FIG. 4 of Non-patent literature 4, for example).

The operations of the FPG are mainly classified into the writing operation and the arithmetic and readout operation.

In the writing operation, for example, the electric voltage or electric current for the writing is applied to the memory element and the memory data is written.

In the arithmetic and readout operation, a process of pre-charging the match line and a process of performing the arithmetic operation of the external input and the memory data are executed in order. Specifically, first, the pre-charging transistor is turned on and the match line is pre-charged with the electric charge. Then, the pre-charge transistor is turned off and the arithmetic operation is executed. At this time, whether or not the electric charge pre-charged in the match line is passed to the ground potential through the pass gate transistor and evaluation transistor is changed in accordance with the result of the arithmetic operation, therefore by this event, an output is determined by 1 or 0.

In addition, because the output is retained until the start of the next pre-charging, the FPG has a function of latching the output.

Further, if the FPG is connected in series, the AND (logical multiply) operation is performed, and if the FPG is connected in parallel, the OR (logical add) operation is performed; therefore, also the logical operation between the results of operation is performed without difficulties.

Next, the logic-in-memory using various non-volatile devices is briefly explained. First, the case that uses a ferroelectric memory (FeRAM) element is explained as an example of the logic-in-memory using the non-volatile device (refer to Non-patent literature 1).

The ferroelectric device called MFS (Metal Ferroelectric Semiconductor) FET is used as the ferroelectric memory element. This MFSFET is formed of three layers of an electrode, ferroelectric thin film and semiconductor and has a structure in which the ferroelectric thin film replaces an $SiO_2$ layer in the typical MOSFET (MOS Field Effect Transistor).

Then, when a voltage V that exceeds a certain voltage Vc is applied from the outside, the relationship between the voltage V and the polarization P inside the ferroelectric has the hysteresis in the ferroelectric. Therefore, a threshold voltage Vth of the MFSFET is changed under the condition of remnant polarization of the ferroelectric.

Accordingly, the threshold voltage changed in accordance with the condition of remnant polarization can be made to correspond to 1 and 0 of the memory data.

In the case where the MFSFET is used as the memory element, the following advantages are obtained:

(1) writing voltage is low and is about ±6V, in comparison with the floating gate MOS transistor used as the flash memory and the like;

(2) memory data can be read out without destruction; and (3) high speed writing is possible, because the change of polarization in the ferroelectric is performed at a high speed.

The arithmetic circuit that performs operation of the input data and memory data may be formed with this MFSFET.

Specifically, for example, a terminal A of the MFSFET is connected to the ground potential, and the other terminal B thereof is connected to the match line (potential Vm), and a pre-charging transistor is connected to the other terminal B to constitute the above-described FPG. (refer to Non-patent literature 1)

Further, with the input data s=1, 0 being assigned to the MFSFET gate potential Vg and the memory data b=1, 0 being assigned to the MFSFET threshold voltage Vth, the switching characteristic f(s, b) of the FPG may be defined as follows:

f(s, b)=1 (A and B are connected)

f(s, b)=0 (A and B are not connected).

This shows that if the match line potential Vm has fallen to the ground potential (GND), f(s, b)=1 and other than that, f(s, b)=0.

When with respect to two kinds of threshold voltages Vth0 and Vth1, Vth1>Vth0 is obtained, three kinds of gate voltages Vg0, Vg1 and Vg2 are defined such that Vg2>Vth1>Vg1>Vth0>Vg0.

At this time, if the Vg0 and Vg1 are assigned to b=0 and b=1 respectively, f(s, b)=1 is obtained only when s=1 and b=0, and so the result is f(s, b)=s&$^-$b, thus the logical multiply of s and $^-$b is obtained. On the other hand, if the Vg1 and Vg2 are assigned to b=0 and b=1 respectively, f(s, b)=0 is obtained only when s=0 and b=1, and so the result is f(s, b)=s|$^-$b, thus the logical add of s and $^-$b is obtained.

As described above, if three values of the gate voltage are provided corresponding to the 1/O of the input data s, the OR/AND operation with the memory data b can be performed.

Furthermore, a matching search circuit called a CAM (Content Addressable Memory) that is one of the associative memories can be configured.

An EXOR operation is used to detect the matching by bit, and this EXOR operation can be executed, by connecting in parallel two FPGs which compute the logical multiply. A structure is arranged in which two FPGs are connected in parallel for one word and are combined such that the output becomes "0" if any one does not match, and consequently the matching search circuit can be obtained.

Further, by forming the circuit with the MFSFET as described above, for example, a 16 bits matching search circuit can be obtained with 64 pieces of transistor in the dynamic circuit based on the MFSFET, whereas 160 pieces of transistor are required in the static circuit based on the SRAM (refer to Non-patent literature 1).

Next, the logic-in-memory that uses a ferroelectric capacitor as the non-volatile devices is explained (refer to Non-patent literature 2 and Non-patent literature 3).

The ferroelectric capacitor has a structure in which a ferroelectric thin layer replaces an insulation layer of a typical capacitor, and the polarization occurs when the different voltages are applied to both ends of the ferroelectric capacitor. Further, the condition of remnant polarization of the ferroelectric capacitor is determined by the condition of remnant polarization before applying the voltage and difference in potential at the time of applying the voltage.

Then, the voltages Vy1 and Vy2 that are applied to the both ends of the ferroelectric capacitor are assigned to two input data y1 and y2 and the condition of remnant polarization is assigned to the memory data S and so, the result of operation yielded by the two input data y1 and y2 can be retained as the condition of remnant polarization. This result of operation is also preserved even if the power is turned off.

At this time, the operation between the two input data y1 and y2 changes to the AND (logical multiply) operation or the OR (logical add) operation in accordance with the condition of remnant polarization, specifically the memory data s.

Further, the AND operation and the OR operation that are between the external input data y1 or y2 and the memory data s can also be performed.

Therefore, the logical operation function and the memory function can simultaneously be obtained when using the ferroelectric capacitor.

Further, the ferroelectric capacitor and the pass gate transistor are connected to constitute above-described FPG.

Moreover, a basic circuit formed of a logic gate and a memory of a typical CMOS static circuit can be obtained with only one piece of FPG, when including a dynamic circuit which turns on and off this FPG. For example, the logical operation and latch circuit can be obtained with only 5 pieces of transistor, whereas 14 pieces of transistor is required if the CMOS static circuit is used (refer to Non-patent literature 3).

As described above, if the logic circuit is configured using the dynamic circuit formed of a ferroelectric capacitor, the logic circuit can be made small in comparison with the logic circuit configured using the static CMOS circuit having the same function.

Next, as the last example of the logic-in-memory using the non-volatile device, the one that uses a TMR (Tunnel MagnetoResistance effect) element used for a MRAM (Magnetoresistive Random Access Memory) and the like, is explained (refer to Non-patent literature 4).

The TMR element has a structure in which three layers of a ferromagnetic layer (magnetization-free layer) where the direction of magnetization is changed by the outside magnetic field, an extremely thin insulation layer and a ferromagnetic layer (magnetization-fixed layer) where the direction of magnetization is fixed without depending on the outside magnetic field are stacked.

This TMR element has a characteristic that the electrical resistance increases and decreases in accordance with the change in the direction of magnetization of the magnetization-free layer due to the outside magnetic field. In other words, the resistance becomes low when the directions of the magnetization-free layer and the magnetization-fixed layer are parallel and the resistance becomes high when the directions of the magnetization-free layer and the magnetization-fixed layer are anti-parallel.

Therefore, the resistance of this TRM element can be stored as memory data.

In order to operate the TMR element as the memory element, the writing wiring is arranged for each TMR element in parallel to the easy-magnetization axis direction of the ferromagnet in the magnetization-free layer, for example, and the bit wiring is arranged in parallel to the difficult-magnetization axis of the ferromagnet in the magnetization-free layer.

Then, when data is written into the TMR element, data of "1" or "0" is written into the TMR element in accordance with the direction of the composite magnetic field caused by electric currents that are applied to the bit wiring and writing wiring, respectively. More precisely, the magnetic field due to the writing wiring occurs along the direction of the difficult-magnetization axis of the ferromagnet in the magnetization-free layer and thereby the anti-magnetic property of the ferromagnet in the magnetization-free layer is reduced. At the same time, the magnetic field due to the bit wiring occurs along the direction of the easy-magnetization axis of the ferromagnet in the magnetization-free layer, and data of "1" or "0" is written in accordance with this direction.

On the other hand, when the data written into the TMR element is read out, electric current is applied to the TMR element from the bit wiring and data of "1" or "0" is discriminated depending on a large or small amount of the electric current that flows.

Further, for example, two TMR elements Rs and Rs' are arranged complementarily, and the FPG can be configured with a readout transistor provided between these two TMR elements Rs and Rs' and a pass gate transistor (refer to FIG. 4 of Non-patent literature 4).

The bit wirings BL1 and BL2 are arranged respectively corresponding to two TMR elements Rs and Rs'.

Further, when memory data is written, the memory data is written by the magnetic field that the bit wiring and writing wiring generate.

When the memory data written is read out, electric current is made to flow into the TMR element by turning the readout transistor on.

The voltage that corresponds to the external input is applied to one of bit wiring BL1 when the arithmetic operation is performed. The gate voltage of the pass gate transistor changes in accordance with the result of arithmetic operation of the external input and the memory data, and the on/off state of the pass gate transistor changes.

With such configuration, the AND (logical multiply) operation between the external input and the memory data can be performed.

Non-patent literature 1: Kimura, Hanyu & Kameyama "The logic memory VLSI using the ferroelectric device and application" The Institute of Electronics, Information & Communication Engineers, paper magazine, C, Vol. J83-C, No. 8, pp. 749–756, August 2000.

Non-patent literature 2: Kimura, Hanyu, Kameyama, Fujimori, Nakamura & Takasu "The constitution of the logic memory VLSI using the ferroelectric device" Institute of Electronics, Information & Communication Engineers (IEICE), paper magazine, C, Vol. J86-C, No. 8, pp. 886–893, August 2003.

Non-patent literature 3: H. Takasu "Application of the ferroelectric to the logic" FED Review. Vol. 2, No. 7, pp. 1–24, Feb. 24, 2003.

Non-patent literature 4: Kimura, Hanyu & Kameyama "The constitution of the logic memory VLSI using the ferroelectric device" Technical report of IEICE, ICD 2003-5, pp. 749–756, April 2003.

SUMMARY OF THE INVENTION

However, there are some problems in the case of constituting the logic-in-memory with using the above-described three kinds of non-volatile devices.

First, when using the MFSFET, the following problems are observed:

First, in comparison with the floating gate MOS transistor, the writing voltage becomes low, however, is still larger than the power voltage for a typical CMOS circuit; therefore another power source or the power booster circuit is required.

Secondly, in order to change the AND operation and the OR operation, the gate voltage has three values due to the offset given to the external input data, and therefore, the peripheral circuit becomes complicated.

Thirdly, although the operation between the external input data and memory data is possible, there is no configuration enabling the operation between two external input data to be performed.

On the contrary, when using the ferroelectric capacitor, the operation between two external input data can be performed and the operation between the external input data and the memory data can also be performed.

However, the following problems remain when using the ferroelectric capacitor:

First, the set action or reset action is required, because the content of the memory data changes due to the result of operation.

Secondly, the occupied area of the ferroelectric capacitor is large, which is not suitable for the high density integration.

Further, the following problems are observed when using the TMR element.

First, the AND (logical multiply) operation between the external input data and the memory data can be performed, however, the OR (logical add) operation therebetween cannot be performed.

Secondly, there is no configuration enabling the operation between two external input data to be performed.

Accordingly, it is considered that an ideal configuration may be obtained as the logic-in-memory if there is a non-volatile device that satisfies all of the following conditions.

First, without requiring the high voltage, a voltage about the supply voltage of the CMOS circuit is used to operate.

Secondly, both the AND operation and OR operation between the external input data and the memory data can be performed, and these operations can be switched.

Thirdly, both the AND operation and the OR operation between two external input data can be performed, and the AND operation and the OR operation are switched according to the memory data.

Fourthly, the case of performing the operation without destructing the memory data, and the case of preserving the result of operation as the memory data are switched according to the usage.

The present invention addresses the above-identified, and other problems associated with conventional methods and apparatuses and provides the arithmetic circuit in which a circuit such as a logic-in-memory that is small and operates at high speed is obtained, various operations can be performed, and high versatility can be obtained.

An arithmetic circuit according to an embodiment of the present invention includes a memory element which has a variable resistance element in which the state of resistance changes reversibly between the state of high resistance and the state of low resistance by applying voltages with different polarities between one electrode and the other electrode, and at least one transistor connected to each of both ends of the memory element, wherein electric potential is applied to each of the both ends of the memory element through the transistor to store data into the memory element and to perform the operation with respect to the external data input through any one of the transistors, and a result of the operation is output from the memory element.

According to the configuration of the arithmetic circuit of the present invention, the memory element including the variable resistance element and at least one transistor connected to each of both ends of the memory element are provided; electrical potential is applied to each of both ends of the memory element through the transistor to store data into the memory element and to perform operation with respect to the external data input through any one of the transistors, and the result of the operation is output from the memory element; and therefore data can be stored in the memory element after changing the resistance of the variable resistance element with comparatively low voltage in accordance with the characteristic of variable resistance element.

Further, by controlling the potential applied to both the ends of the memory element, the non-destructive operation in which the data stored in the memory element is not changed after the operation and the destructive operation in which the data stored in the memory element is changed by the operation can be performed individually.

Accordingly, by controlling the potential applied to both the ends of the memory element, the operation between the external data and the data stored into the memory element and the operation between one external data and another external data can be performed individually.

Furthermore, by changing the potential and the like applied to both the ends of the memory element, switching between the AND (logical multiply) operation and OR (logical add) operation can be performed in the non-destructive operation and destructive operation, respectively.

In the above-described arithmetic circuit of the present invention, such a configuration of the memory element can also be obtained, in which one electrode of each element in two variable resistance elements is mutually connected to be a common terminal and the other electrode of each element of the two variable resistance elements is separated and is each provided with a terminal to be three terminals in total, at least one transistor is connected to each of the other terminals provided at the other electrodes of the memory element, and a result of the operation is output from the common terminal.

With such a configuration, one of electrodes in each of two variable resistance elements is the common terminal in the memory element, and so two variable resistance elements are connected in series between the other electrodes of two variable resistance elements. Then, when a voltage is applied between these other electrodes, the voltage acts with respect to one variable resistance element of two variable resistance elements to change the state of high resistance into the state of low resistance, and acts with respect to the other variable resistance element of two variable resistance elements to change the state of low resistance into the state of high resistance, that is, acts complementarily. Accordingly, one of the variable resistance elements is changed to the state of low resistance and the other variable resistance element is changed to the state of high resistance, respectively, and then the state after being changed can be preserved securely.

Further, if a voltage of the polarity reverse to the above-described voltage is applied between the other electrodes, one of the variable resistance elements is changed to the state of high resistance and the other variable resistance element is changed to the state of low resistance, respectively, and by doing so, the combination of the states of resistance of the first variable resistance element and the second variable resistance element can be changed.

Accordingly, data can be stored in the memory element using the combination of the states of resistance of the first variable resistance element and the second variable resistance element, that is, using the case in which the combination is the state of high resistance and the state of low resistance and the case in which the combination is the state of low resistance and the state of high resistance.

Further, when the state of resistance of two variable resistance elements is changed, the variable resistance in the state of high resistance changes to the state of low resistance previously, and subsequently the variable resistance in the state of low resistance changes to the state of high resistance, therefore, there exists the intermediate state where both of two variable resistance elements become the state of low resistance.

Further, the period of time when the intermediate state exists is short and, other than that time, since one of two variable resistance elements is in the state of high resistance, the composite resistance of the whole of the memory element becomes high to be constant, and the electric current flowing through the memory element becomes small. In this way, on the occasions of data recording or erasing and data read-out, the flowing electric current by applying the voltage to the memory element can be reduced.

Furthermore, because the potential of the common terminal, specifically the output terminal, of the memory element is greatly changed by the combination of the states of resistance of the first variable resistance element and the second variable resistance element, that is, the content of data stored in the memory element, the sufficient potential difference is obtained at the output terminal from which the result of operation is output. Further, the value of voltage at the output terminal can be binary.

According to the embodiment of the arithmetic circuit of the present invention, the function considered to be ideal as a logic-in-memory satisfying all the following conditions can be obtained:

First, high voltage is not required, and the voltage about the supply voltage of the CMOS circuit is used to operate.

Secondly, both the AND (logical multiply) operation and OR (logical add) operation between the external input data and the memory data can be performed, and switching thereof can also be performed.

Thirdly, both the AND operation and the OR operation between two external input data can be performed, and the AND operation and the OR operation are switched according to the memory data.

Fourthly, the case of performing the operation without destructing the memory data and the case of preserving the result of operation as the memory data are switched according to the usage.

Particularly, because the potential difference in the output as a result of operation can be made large when the memory element has a configuration in which two variable resistance elements are connected to provide three terminals, a margin in order to perform a stable action can be secured widely either in the case where the pass gate transistor is turned on or off by the output or in the case where the output is amplified with the sense amplifier and the like.

Further, because the value of voltage of the output terminal can be made binary, only one kind of a threshold voltage for the output is needed; therefore the configuration of next stage of the arithmetic circuit can be simplified.

Furthermore, the logical multiply operation and the logical add operation can be switched by means of corresponding software without changing the threshold voltage.

Furthermore, because the composite resistance in the stable state is high and constant, the electric current that flows through the variable resistance element becomes small and the power consumption can be controlled.

BRIEF DESCRIPTION OF THE DRAWINGS

FIG. 1 is a schematic configuration diagram (circuit diagram) of the arithmetic circuit according to an embodiment of the present invention;

FIG. 2A is a sectional view showing a film structure of a variable resistance element of FIG. 1, and FIG. 2B is a diagram showing a circuit symbol of the variable resistance element of FIG. 2A;

FIGS. 6A to 6D are the diagrams showing the possible states of the memory element shown in FIG. 4A;

FIG. 7 is a diagram showing the transition of the states to explain the action in the case of applying the writing voltage to the memory element of FIG. 4A;

DESCRIPTION OF THE PREFERRED EMBODIMENTS

Figure 3:
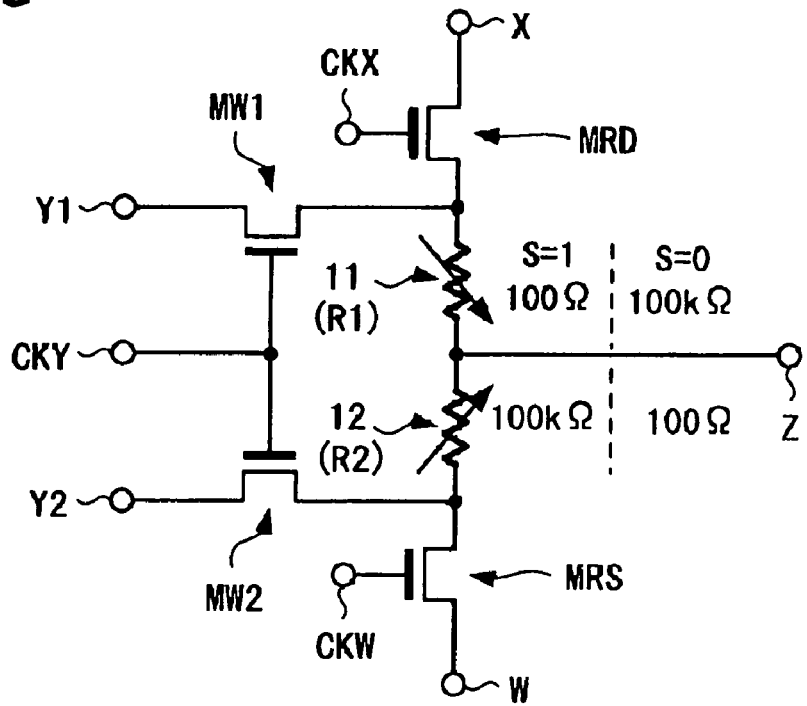
FIG. 3 is a schematic configuration diagram (circuit diagram) of the arithmetic circuit according to another embodiment of the present invention.

As an embodiment of the arithmetic circuit of the present invention, a schematic configuration diagram (circuit diagram) is shown in FIG. 1.

This arithmetic circuit constitutes the logic-in-memory mentioned above, and includes one non-volatile device and four MOS transistors for the control use.

In the arithmetic circuit according to an embodiment of the present invention, a variable resistance element R is specifically used as the non-volatile device instead of the various non-volatile devices described above (such as a ferroelectric, ferroelectric capacitor and TMR element).

In a variable resistance element R, a terminal Z1 and a terminal Z2 are provided at both ends.

In a MOS transistor MRD, a source is connected to the terminal Z1, and a drain is connected to an external input X, and a terminal of clock CKX is connected to a gate.

In a MOS transistor MRS, a source is connected to the terminal Z2, and a drain is connected to an external input W, and a terminal of clock CKW is connected to a gate.

In a MOS transistor MW1, a source is connected to the terminal Z1, and a drain is connected to an external input Y1, and a terminal of clock CKY is connected to a gate.

In a MOS transistor MW2, a source is connected to the terminal Z2, and a drain is connected to an external input Y2, and a terminal of clock CKY is connected to a gate.

Note that, although explanations are made in which a drain and a source are distinguished to be connected, either of the drain and source may be connected to the external input side because these can be exchanged in the MOS transistor.

As the variable resistance element R, a variable resistance element R having the film structure shown in the sectional view of FIG. 2A can be used.

The variable resistance element R shown in FIG. 2A has a film structure in which a conductive film 3 and an insulation film 4 are held between two electrodes 1 and 2. If the voltage is applied so that electric current I flows from the conductive film 3 toward the insulation film 4, the variable resistance element R changes into low resistance and the data is written, and If the voltage is applied so that the electric current flows from the insulation film 4 toward the conductive film 3, the variable resistance element R changes into high resistance and the data is erased.

In addition, this variable resistance element R can be described with the same circuit symbol as the circuit symbol of a typical variable resistance, as shown in FIG. 2B, and the direction of arrow is made to be the same as the direction of the electric current when the writing shown in FIG. 2A is performed.

As the conductive film 3 constituting the variable resistance element R, for example, a metal film that contains metal such as Cu, Ag, Zn and the like, an alloy film (for example, CuTe alloy film), a metal compound film and so on are listed.

Further, as the insulation film 4, for example, an amorphous $Gd_2O_3$ and an insulator such as $SiO_2$ are listed.

As a specific configuration of a film structure, for example, a CuTe film is formed with the film thickness of 20 nm as the conductive film 3, and the amorphous $Gd_2O_3$ is formed thereon with the film thickness of 5 nm as the insulation film 4.

In the case of using such material film, there is such a characteristic that the metal elements of Cu, Ag, Zn and the like contained in the conductive film 3 are ionized and drawn closer on the side of the negative electrode.

Therefore, if the voltage is applied between the electrodes 1 and 2 of the top and bottom of the variable resistance element R so that the electrode 2 on the side of the insulation film 4 becomes low potential, an ion of the metal element is drawn to the electrode 2 and enters the insulation film 4. Then, when the ion reaches to the electrode 2, the top and bottom electrodes 1 and 2 become conductive, and the resistance decreases.

On the other hand, if the voltage is applied between the top and bottom electrodes 1 and 2 of the variable resistance element R so that the electrode 1 on the side of the conductive film 3 becomes low potential, the metal element is ionized and drawn to the electrode 1 and is pulled out from the insulation film 4; therefore, the non-conductivity between the top and bottom electrodes 1 and 2 increases, and accordingly the resistance increases.

By repeating the change as such, the resistance value of the variable resistance element R can be changed reversibly between the state of high resistance and the state of low resistance.

Because the variable resistance element R having such film structure is not dependent on the element size and a high signal can be obtained, and therefore the variable resistance element R has an advantage in characteristic with respect to scaling.

Further, the variable resistance element R has advantages that the data writing speed by means of the change in resistance can be speeded up, about 5 nanoseconds, for example, and can be operated by the low voltage (about 1V for example) and the low electric current (about 20 μA, for example).

In FIG. 1, the variable resistance element R is shown with the same circuit symbol as FIG. 2B and is arranged so that the arrow points downward. That is, if the voltage is applied so that the electric current flows from the terminal Z1 to the terminal Z2, the variable resistance element R becomes the low resistance, and if the voltage is applied so that the electric current flows from the terminal Z2 to the terminal Z1, the variable resistance element R becomes the high resistance.

In addition, a resistance value is 100 kΩ when the variable resistance element R is the high resistance, and a resistance value is 100 Ω when the variable resistance element R is the low resistance.

Further, the ON resistance of MOS transistors is 100 Ω to make explanations simplified. Though those values may not necessarily be obtained, typically those are proper values.

Then, as the memory data s, the state where the variable resistance element R is the low resistance (100 Ω) is defined as "S=1 state", and the state where the variable resistance element R is the high resistance (100 kΩ) is defined as "S=0 state".

Further, when the data writing threshold value of the variable resistance element R is defined as Vwr, and the data erasing threshold value is defined as Ver, it is assumed that the following relationships are obtained:

$$0.3V < Ver < 1.0V, \; 0.3V < Vwr < 1.0V \quad (1)$$

Though the numerical value used here is not necessarily accurate, these are typically proper numerical values.

Further, the signal given to each terminal is respectively defined as follows:

with respect to the external input Y1, the terminal voltage Vy1=0V when Y1=0, the terminal voltage Vy1=1V when Y1=1;

with respect to the external input Y2, the terminal voltage Vy2=0V when Y2=0, the terminal voltage Vy2=1V when Y2=1;

with respect to the clock CKX, the voltage Vckx=0V when CKX=0, the voltage Vckx=1V when CKX=1;

with respect to the clock CKY, the voltage Vcky=0V when CKY=0, the voltage Vcky=1V when CKY=1;

with respect to the clock CKW, that is the reset input, the voltage Vckw=0V when CKW=0, the voltage Vckw=1V when CKW=1;

with respect to the external input X, the terminal voltage Vx=0.0V when X=0, the terminal voltage Vx=0.3V when X=1; and with respect to the external input W, the terminal voltage Vw=0.0V when W=0, the terminal voltage Vw=0.3V when X=1.

The basic action of the arithmetic circuit according to an embodiment of the present invention is that: after storing the memory data S into the variable resistance element R through the MOS transistor, the logical operation is performed between the external data input through any of MOS transistors and the memory data S, and the result thereof is output from one of the terminals Z1 and Z2 (terminal voltages Vz1 and Vz2) at both ends of the variable resistance element.

Further, as the modes of operation in the arithmetic circuit of this embodiment, two kinds of operation, that is, the non-destructive operation where the memory data S is preserved after the operation and the destructive operation where the memory data S is changed by the operation are possible.

First, the case in which the non-destructive operation between the external input W or the external input X and the memory data S is performed is explained.

The procedure in this case is as follows:

Prior to the operation, the memory data S is written into the variable resistance element R.

Specifically, after setting to (Vy1, Vy2)=(1V, 0V) or (0V, 1V), CKY=1, CKX=CKW=0 are set.

With this, because the transistors MW1 and MW2 are turned on and the transistors MRD and MRS are turned off, the result is R=100Ω or 100 kΩ, therefore, S=1 or S=0 is written as the memory data S.

Next, the operation with the external input is performed.

Specifically, after setting one of the voltages Vx and Vw to 0.3V and setting the other thereof to 0.0V respectively in accordance with the value of the external input W or the external input X (1 or 0), CKY=0, CKX=CKW=1 are set.

With this, because the transistors MW1 and MW2 are turned off and the transistors MRD and MRS are turned on, four kinds of voltages 0V, 0.1V, 0.2V and 0.3V appear as the Vz1 and Vz2 in accordance with the combination of each value of W, X, S.

Further, by making those binary with the threshold voltage Vth of 0.05V or 0.25, the result of the logical operation of the external input X and memory data S or the logical operation of the external input W and memory data S is obtained.

TABLE 1 shows the case in which the non-destructive logical multiply is obtained between the external input X and the memory data S, when W=0 is fixed. In this case, the result of operation of Z1=X&¯S is obtained by making the threshold of Vz1 as Vth=0.25V, and the result of operation of Z2=X&S is obtained by making the threshold of Vz2 as Vth=0.05V.

TABLE 2 shows the case in which the non-destructive logical add is obtained between the external input X and the memory data S, when W=1 is fixed. In this case, the result of operation of Z1=X|S is obtained by making the threshold of Vz1 as Vth=0.05V, and the result of operation of Z2=X|¯S is obtained by making the threshold of Vz2 as Vth=0.25V.

TABLE 3 shows the case in which the non-destructive logical multiply is obtained between the external input W and the memory data S, when X=0 is fixed. In this case, the result of operation of Z1=W&S is obtained by making the threshold of Vz1 as Vth=0.05V, and the result of operation of Z2=W&¯S is obtained by making the threshold of Vz2 as Vth=0.25V.

TABLE 4 shows the case in which the non-destructive logical add is obtained between the external input W and the memory data S, when X=1 is fixed. In this case, the result of operation of Z1=W|¯S is obtained by making the threshold of Vz1 as Vth=0.25V, and the result of operation of Z2=W|S is obtained by making the threshold of Vz2 as Vth=0.05V.

Note that, though a value 299 μV appears as the value of Vz1 and Vz2 in TABLES 1 to 4, this value is treated as 0.0V. It shall also be treated similarly hereinafter.

[TABLE 1, TABLE 2, TABLE 3 and TABLE 4]

TABLE 1

| INPUT | SET | WRITE | | | READ | | | Vth = 0.25 V | | Vth = 0.05 V |
|---|---|---|---|---|---|---|---|---|---|---|
| X | S | W | Vy1 | Vy2 | R | Vw | Vx | Vz1 | X & ~S | Vz2 | X & S |
| 0 | 0 | 0 | 0 V | 1 V | 100 kΩ | 0 V | 0 v | 0.0 V | FALSE | 0.0 V | FALSE |
| 0 | 1 | 0 | 1 V | 0 V | 100 Ω | 0 V | 0 v | 0.0 V | FALSE | 0.0 V | FALSE |
| 1 | 0 | 0 | 0 V | 1 V | 100 kΩ | 0 V | 0.3 V | 0.3 V | TRUE | 299 μV | FALSE |
| 1 | 1 | 0 | 1 V | 0 V | 100 Ω | 0 V | 0.3 V | 0.2 V | FALSE | 0.1 V | TRUE |

TABLE 2

| INPUT | SET | WRITE | | | READ | | | Vth = 0.05 V | | Vth = 0.25 V |
|---|---|---|---|---|---|---|---|---|---|---|
| X | S | W | Vy1 | Vy2 | R | Vw | Vx | Vz1 | X \| S | Vz2 | X \| ~S |
| 0 | 0 | 1 | 0 V | 1 V | 100 kΩ | 0.3 V | 0 v | 299 μV | FALSE | 0.3 V | TRUE |
| 0 | 1 | 1 | 1 V | 0 V | 100 Ω | 0.3 V | 0 v | 0.1 V | TRUE | 0.2 V | FALSE |
| 1 | 0 | 1 | 0 V | 1 V | 100 kΩ | 0.3 V | 0.3 V | 0.3 V | TRUE | 0.3 V | TRUE |
| 1 | 1 | 1 | 1 V | 0 V | 100 Ω | 0.3 V | 0.3 V | 0.3 V | TRUE | 0.3 V | TRUE |

TABLE 3

| INPUT | SET | WRITE | | | READ | | | Vth = 0.05 V | | Vth = 0.25 V |
|---|---|---|---|---|---|---|---|---|---|---|
| W | S | X | Vy1 | Vy2 | R | Vw | Vx | Vz1 | W & S | Vz2 | W & ~S |
| 0 | 0 | 0 | 0 V | 1 V | 100 kΩ | 0 V | 0 v | 0.0 V | FALSE | 0.0 V | FALSE |
| 0 | 1 | 0 | 1 V | 0 V | 100 Ω | 0 V | 0 v | 0.0 V | FALSE | 0.0 V | FALSE |
| 1 | 0 | 0 | 0 V | 1 V | 100 kΩ | 0.3 V | 0 v | 299 μV | FALSE | 0.3 V | TRUE |
| 1 | 1 | 0 | 1 V | 0 V | 100 Ω | 0.3 V | 0 v | 0.1 V | TRUE | 0.2 V | FALSE |

TABLE 4

| INPUT | SET | WRITE | | | READ | | | Vth = 0.25 V | | Vth = 0.05 V |
|---|---|---|---|---|---|---|---|---|---|---|
| W | S | X | Vy1 | Vy2 | R | Vw | Vx | Vz1 | W \| ~S | Vz2 | W \| S |
| 0 | 0 | 1 | 0 V | 1 V | 100 kΩ | 0 v | 0.3 V | 0.3 V | TRUE | 299 μV | FALSE |
| 0 | 1 | 1 | 1 V | 0 V | 100 Ω | 0 v | 0.3 V | 0.2 V | FALSE | 0.1 V | TRUE |
| 1 | 0 | 1 | 0 V | 1 V | 100 kΩ | 0.3 V | 0.3 V | 0.3 V | TRUE | 0.3 V | TRUE |
| 1 | 1 | 1 | 1 V | 0 V | 100 Ω | 0.3 V | 0.3 V | 0.3 V | TRUE | 0.3 V | TRUE |

Next, the case in which the destructive operation is performed between the external inputs Y1, Y2 and the memory data S is explained.

The procedure in this case is as follows:

Prior to the operation, the memory data S is written into the variable resistance element R.

Specifically, after setting to (Vx, Vw)=(1V, 0V) or (0V, 1V), CKY=0, CKX=CKW=1 are set.

With this, because the transistors MW1 and MW2 are turned off, and the transistors MRD and MRS are turned on, the result is R=100Ω or 100 kΩ, therefore, S=1 or S=0 is written as the memory data S.

Next, the operation of the external inputs Y1, Y2 is performed.

Specifically, after setting the external input Y1 and the external input Y2 to either 1 or 0 respectively (any of the combination of four kinds), CKY=1, CKX=CKW=0 are set.

With this, because the transistors MW1 and MW2 are turned on and the transistors MRD and MRS are turned off, the voltage applied to both ends of the variable resistance R are changed in accordance with the combination of the values of Y1 and Y2.

Further, the resistance value of the variable resistance element R is changed by one kind among four kinds of combination (the kind differs according to the content of the memory data S), and the value of the memory data S is rewritten.

Next, the result of operation is read out.

Specifically, after setting to (Vx, Vw)=(0.0V, 0.3V) or (0.3V, 0.0V), CKY=0, CKX=CKW=1 are set.

With this, because the transistors MW1 and MW2 are turned off and the transistors MRD and MRS are turned on, four kinds of voltages 0V, 0.1V, 0.2V and 0.3V appear as the Vz1 and Vz2 in accordance with the combination of each value of Y1, Y2, S.

Further, by making those binary with the threshold voltage Vth of 0.05V or the 0.25, the results of the logical operation between the external inputs Y1 and Y2, of the logical operation of the external input Y1 and memory data S, and the logical operation of the external input Y2 and memory data S are obtained.

Four tables from TABLE 5 to TABLE 8 show the various combinations in the case in which the logical operation (destructive operation) is performed between two external inputs Y1 and Y2.

TABLE 5 shows the case in which the memory data is set as S=0, the operation between two external inputs Y1 and Y2 is performed and the result of operation is read out with Vw=0V and Vx=0.3V. In this case, the result of operation of Z1=¯Y1|Y2 is obtained by making the threshold of Vz1 as Vth=0.25V, and the result of operation of Z2=Y1&¯Y2 is obtained by making the threshold of Vz2 as Vth=0.05V.

Vth=0.25V, and the result of operation of Z2=Y1|¯Y2 is obtained by making the threshold of Vz2 as Vth=0.05V.

TABLE 8 shows the case in which the memory data is set as S=1, the operation between two inputs Y1 and Y2 is performed and the result of operation is read out with Vw=0.3V and Vx=0V. In this case, the result of operation of Z1=Y1|¯Y2 is obtained by making the threshold of Vz1 as Vth=0.05V, and the result of operation of Z2=¯Y1&Y2 is obtained by making the threshold of Vz2 as Vth=0.25V.

[TABLE 5, TABLE 6, TABLE 7 and TABLE 8]

TABLE 5

| SET | | INPUT | | WRITE | | READ | | | Vth = 0.25 V | Vth = 0.05 V |
|---|---|---|---|---|---|---|---|---|---|---|
| S | R | Y1 | Y2 | S' | R' | Vw | Vx | Vz1 | ¯Y1 \| Y2 | Vz2 | Y1 & ¯Y2 |
| 0 | 100 kΩ | 0 | 0 | 0 | 100 kΩ | 0 v | 0.3 V | 0.3 V | TRUE | 299 μV | FALSE |
| 0 | 100 kΩ | 0 | 1 | 0 | 100 kΩ | 0 v | 0.3 V | 0.3 V | TRUE | 299 μV | FALSE |
| 0 | 100 kΩ | 1 | 0 | 1 | 100 Ω | 0 v | 0.3 V | 0.2 V | FALSE | 0.1 V | TRUE |
| 0 | 100 kΩ | 1 | 1 | 0 | 100 kΩ | 0 v | 0.3 V | 0.3 V | TRUE | 299 μV | FALSE |

TABLE 6

| SET | | INPUT | | WRITE | | READ | | | Vth = 0.05 V | Vth = 0.25 V |
|---|---|---|---|---|---|---|---|---|---|---|
| S | R | Y1 | Y2 | S' | R' | Vw | Vx | Vz1 | Y1 & ¯Y2 | Vz2 | ¯Y1 \| Y2 |
| 0 | 100 kΩ | 0 | 0 | 0 | 100 kΩ | 0.3 V | 0 v | 299 μV | FALSE | 0.3 V | TRUE |
| 0 | 100 kΩ | 0 | 1 | 0 | 100 kΩ | 0.3 V | 0 v | 299 μV | FALSE | 0.3 V | TRUE |
| 0 | 100 kΩ | 1 | 0 | 1 | 100 Ω | 0.3 V | 0 v | 0.1 V | TRUE | 0.2 V | FALSE |
| 0 | 100 kΩ | 1 | 1 | 0 | 100 kΩ | 0.3 V | 0 v | 299 μV | FALSE | 0.3 V | TRUE |

TABLE 7

| SET | | INPUT | | WRITE | | READ | | | Vth = 0.25 V | Vth = 0.05 V |
|---|---|---|---|---|---|---|---|---|---|---|
| S | R | Y1 | Y2 | S' | R' | Vw | Vx | Vz1 | ¯Y1 & Y2 | Vz2 | Y1 \| Y2 |
| 1 | 100 Ω | 0 | 0 | 1 | 100 Ω | 0 v | 0.3 V | 0.2 V | FALSE | 0.1 V | TRUE |
| 1 | 100 Ω | 0 | 1 | 0 | 100 kΩ | 0 v | 0.3 V | 0.3 V | TRUE | 299 μV | FALSE |
| 1 | 100 Ω | 1 | 0 | 1 | 100 kΩ | 0 v | 0.3 V | 0.2 V | FALSE | 0.1 V | TRUE |
| 1 | 100 Ω | 1 | 1 | 1 | 100 Ω | 0 v | 0.3 V | 0.2 V | FALSE | 0.1 V | TRUE |

TABLE 8

| SET | | INPUT | | WRITE | | READ | | | Vth = 0.05 V | Vth = 0.25 V |
|---|---|---|---|---|---|---|---|---|---|---|
| S | R | Y1 | Y2 | S' | R' | Vw | Vx | Vz1 | Y1 \| ¯Y2 | Vz2 | ¯Y1 & Y2 |
| 1 | 100 Ω | 0 | 0 | 1 | 100 Ω | 0.3 V | 0 v | 0.1 V | TRUE | 0.2 V | FALSE |
| 1 | 100 Ω | 0 | 1 | 0 | 100 kΩ | 0.3 V | 0 v | 299 μV | FALSE | 0.3 V | TRUE |
| 1 | 100 Ω | 1 | 0 | 1 | 100 Ω | 0.3 V | 0 v | 0.1 V | TRUE | 0.2 V | FALSE |
| 1 | 100 Ω | 1 | 1 | 1 | 100 Ω | 0.3 V | 0 v | 0.1 V | TRUE | 0.2 V | FALSE |

TABLE 6 shows the case in which the memory data is set as S=0, the operation between two inputs Y1 and Y2 is performed and the result of operation is read out with Vw=0.3V and Vx=0V. In this case, the result of operation of Z1 Y1&¯Y2 is obtained by making the threshold of Vz1 as Vth=0.05V, and the result of operation of Z2=¯Y1|Y2 is obtained by making the threshold of Vz2 as Vth=0.25V.

TABLE 7 shows the case in which the memory data is set as S=1, the operation between two inputs Y1 and Y2 is performed and the result of operation is read out with Vw=0V and Vx=0.3V. In this case, the result of operation of Z=¯Y1&Y2 is obtained by making the threshold of Vz1 as The four tables from TABLE 9 to TABLE 12 show the various combinations in the case of performing the logical operation (destructive operation) of the external inputs Y2 and the memory data S.

TABLE 9 shows the case in which Y1=0 is fixed, the operation between the external input Y2 and the memory data S is performed and the result of operation is read out with Vw=0V and Vx=0.3V. In this case, the result of operation of Z1=¯S|Y2 is obtained by making the threshold of Vz1 as Vth=0.25V, and the result of operation of Z2=S&¯Y2 is obtained by making the threshold of Vz2 as Vth=0.05V.

TABLE 10 shows the case in which Y1=0 is fixed, the operation between the external input Y2 and the memory data S is performed and the result of operation is read out with Vw=0.3V and Vx=0V. In this case, the result of operation of Z1=S&¯Y2 is obtained by making the threshold of Vz1 as Vth=0.05V, and the result of operation of Z2=¯S|Y2 is obtained by making the threshold of Vz2 as Vth=0.25V.

with Vw=0.3V and Vx=0V. In this case, the result of operation of Z1=S|¯Y2 is obtained by making the threshold of Vz1 as Vth=0.05V, and the result of operation of Z2=¯S&Y2 is obtained by making the threshold of Vz2 as Vth=0.25V.

[TABLE 9, TABLE 10, TABLE 11 and TABLE 12]

TABLE 9

| SET | | OPERATE | | WRITE | | READ | | | Vth = 0.25 V | | Vth = 0.05 V |
|---|---|---|---|---|---|---|---|---|---|---|---|
| S | R | Y1 | Y2 | S' | R' | Vw | Vx | Vz1 | ¯S \| Y2 | Vz2 | S & ¯Y2 |
| 0 | 100 kΩ | 0 | 0 | 0 | 100 kΩ | 0 v | 0.3 V | 0.3 V | TRUE | 299 μV | FALSE |
| 0 | 100 kΩ | 0 | 1 | 0 | 100 kΩ | 0 v | 0.3 V | 0.3 V | TRUE | 299 μV | FALSE |
| 1 | 100 Ω | 0 | 0 | 1 | 100 Ω | 0 v | 0.3 V | 0.2 V | FALSE | 0.1 V | TRUE |
| 1 | 100 Ω | 0 | 1 | 0 | 100 kΩ | 0 v | 0.3 V | 0.3 V | TRUE | 299 μV | FALSE |

TABLE 10

| SET | | OPERATE | | WRITE | | READ | | | Vth = 0.05 V | | Vth = 0.25 V |
|---|---|---|---|---|---|---|---|---|---|---|---|
| S | R | Y1 | Y2 | S' | R' | Vw | Vx | Vz1 | S & ¯Y2 | Vz2 | ¯S \| Y2 |
| 0 | 100 kΩ | 0 | 0 | 0 | 100 kΩ | 0.3 V | 0 v | 299 μV | FALSE | 0.3 V | TRUE |
| 0 | 100 kΩ | 0 | 1 | 0 | 100 kΩ | 0.3 V | 0 v | 299 μV | FALSE | 0.3 V | TRUE |
| 1 | 100 Ω | 0 | 0 | 1 | 100 Ω | 0.3 V | 0 v | 0.1 V | TRUE | 0.2 V | FALSE |
| 1 | 100 Ω | 0 | 1 | 0 | 100 kΩ | 0.3 V | 0 v | 299 μV | FALSE | 0.3 V | TRUE |

TABLE 11

| SET | | OPERATE | | WRITE | | READ | | | Vth = 0.25 V | | Vth = 0.05 V |
|---|---|---|---|---|---|---|---|---|---|---|---|
| S | R | Y1 | Y2 | S' | R' | Vw | Vx | Vz1 | ¯S & Y2 | Vz2 | S \| ¯Y2 |
| 0 | 100 kΩ | 1 | 0 | 1 | 100 Ω | 0 v | 0.3 V | 0.2 V | FALSE | 0.1 V | TRUE |
| 0 | 100 kΩ | 1 | 1 | 0 | 100 kΩ | 0 v | 0.3 V | 0.3 V | TRUE | 299 μV | FALSE |
| 1 | 100 Ω | 1 | 0 | 1 | 100 Ω | 0 v | 0.3 V | 0.2 V | FALSE | 0.1 V | TRUE |
| 1 | 100 Ω | 1 | 1 | 1 | 100 kΩ | 0 v | 0.3 V | 0.2 V | FALSE | 0.1 V | TRUE |

TABLE 12

| SET | | OPERATE | | WRITE | | READ | | | Vth = 0.05 V | | Vth = 0.25 V |
|---|---|---|---|---|---|---|---|---|---|---|---|
| S | R | Y1 | Y2 | S' | R' | Vw | Vx | Vz1 | S \| ¯Y2 | Vz2 | ¯S & Y2 |
| 0 | 100 kΩ | 1 | 0 | 1 | 100 Ω | 0.3 V | 0 v | 0.1 V | TRUE | 0.2 V | FALSE |
| 0 | 100 kΩ | 1 | 1 | 0 | 100 kΩ | 0.3 V | 0 v | 299 μV | FALSE | 0.3 V | TRUE |
| 1 | 100 Ω | 1 | 0 | 1 | 100 Ω | 0.3 V | 0 v | 0.1 V | TRUE | 0.2 V | FALSE |
| 1 | 100 Ω | 1 | 1 | 1 | 100 Ω | 0.3 V | 0 v | 0.1 V | TRUE | 0.2 V | FALSE |

S|Y2 is obtained by making the threshold of Vz2 as Vth=0.25V.

TABLE 11 shows the case in which Y1=1 is fixed, the operation between the external input Y2 and the memory data S is performed and the result of operation is read out with Vw=0V and Vx=0.3V. In this case, the result of operation of Z1=¯S&Y2 is obtained by making the threshold of Vz1 as Vth=0.25V, and the result of operation of Z2=S|¯Y2 is obtained by making the threshold of Vz2 as Vth=0.05V.

TABLE 12 shows the case in which Y1=1 is fixed, the operation between the external input Y2 and the memory data S is performed and the result of operation is read out Four tables from TABLE 13 to TABLE 16 show the various combinations in the case of performing the logical operation (destructive operation) of the external inputs Y1 and the memory data S.

TABLE 13 shows the case in which Y2=0 is fixed, the operation between the external input Y1 and the memory data S is performed and the result of operation is read out with Vw=0V and Vx=0.3V. In this case, the result of operation of Z1=¯(Y1|S) is obtained by making the threshold of Vz1 as Vth=0.25V, and the result of operation of Z2=Y1|S is obtained by making the threshold of Vz2 as Vth=0.05V.

TABLE 14 shows the case in which Y2=0 is fixed, the operation between the external input Y1 and the memory data S is performed and the result of operation is read out with Vw=0.3V and Vx=0V. In this case, the result of operation of Z1=Y1|S is obtained by making the threshold of Vz1 as Vth=0.05V, and the result of operation of Z2=¯(Y1|S) is obtained by making the threshold of Vz2 as Vth=0.25V.

TABLE 15 shows the case in which Y2=1 is fixed, the operation between the external input Y1 and the memory data S is performed and the result of operation is read out with Vw=0V and Vx=0.3V. In this case, the result of operation of Z1=¯(Y1&S) is obtained by making the threshold of Vz1 as Vth=0.25V, and the result of operation of Z2=Y1&S is obtained by making the threshold of Vz2 as Vth=0.05V.

TABLE 16 shows the case in which Y2=1 is fixed, the operation between the external input Y1 and the memory data S is performed and the result of operation is read out with Vw=0.3V and Vx=0V. In this case, the result of operation of Z1=Y1&S is obtained by making the threshold of Vz1 as Vth=0.05V, and the result of operation of Z2=¯(Y1&S) is obtained by making the threshold of Vz2 as Vth=0.25V.

[TABLE 13, TABLE 14, TABLE 15 and TABLE 16]

Further, in any of the cases shown from TABLE 5 to TABLE 16, because Z2=¯Z1, an inverted output or an un-inverted output can be obtained by selecting the output terminals Z1 and Z2 in accordance with the necessity.

According to this embodiment of the configuration of the arithmetic circuit, because the arithmetic circuit having the arithmetic unit and memory element is configured with the variable resistance element R as the non-volatile device, the arithmetic circuit can perform a high speed operation and can be configured to be small.

Further, with the characteristic of the variable resistance element R, the resistance value of the variable resistance element R is made to change with a comparatively low voltage (about 2V for example), and the memory data S can be written.

Further, all of the non-destructive operation, the operation between the external inputs and the operation of the external input and the memory data can be performed, and both the AND (logical multiply) operation and the OR (logical add) operation can be performed with respect to all the above operations.

TABLE 13

| SET | | OPERATE | | WRITE | | READ | | Vth = 0.25 V | | Vth = 0.05 V |
|---|---|---|---|---|---|---|---|---|---|---|
| S | R | Y1 | Y2 | S' | R' | Vw | Vx | Vz1 | ¯(Y1 \| S) | Vz2 | Y1 \| S |
| 0 | 100 kΩ | 0 | 0 | 0 | 100 kΩ | 0 v | 0.3 V | 0.3 V | TRUE | 299 µV | FALSE |
| 0 | 100 kΩ | 1 | 0 | 1 | 100 Ω | 0 v | 0.3 V | 0.2 V | FALSE | 0.1 V | TRUE |
| 1 | 100 Ω | 0 | 0 | 1 | 100 Ω | 0 v | 0.3 V | 0.2 V | FALSE | 0.1 V | TRUE |
| 1 | 100 Ω | 1 | 0 | 1 | 100 Ω | 0 v | 0.3 V | 0.2 V | FALSE | 0.1 V | TRUE |

TABLE 14

| SET | | OPERATE | | WRITE | | READ | | Vth = 0.05 V | | Vth = 0.25 V |
|---|---|---|---|---|---|---|---|---|---|---|
| S | R | Y1 | Y2 | S' | R' | Vw | Vx | Vz1 | Y1 \| S | Vz2 | ¯(Y1 \| S) |
| 0 | 100 kΩ | 0 | 0 | 0 | 100 kΩ | 0.3 V | 0 v | 299 µV | FALSE | 0.3 V | TRUE |
| 0 | 100 kΩ | 1 | 0 | 1 | 100 Ω | 0.3 V | 0 v | 0.1 V | TRUE | 0.2 V | FALSE |
| 1 | 100 Ω | 0 | 0 | 1 | 100 Ω | 0.3 V | 0 v | 0.1 V | TRUE | 0.2 V | FALSE |
| 1 | 100 Ω | 1 | 0 | 1 | 100 Ω | 0.3 V | 0 v | 0.1 V | TRUE | 0.2 V | FALSE |

TABLE 15

| SET | | OPERATE | | WRITE | | READ | | Vth = 0.25 V | | Vth = 0.05 V |
|---|---|---|---|---|---|---|---|---|---|---|
| S | R | Y1 | Y2 | S' | R' | Vw | Vx | Vz1 | ¯(Y1 & S) | Vz2 | Y1 & S |
| 0 | 100 kΩ | 0 | 1 | 0 | 100 kΩ | 0 v | 0.3 V | 0.3 V | TRUE | 299 µV | FALSE |
| 0 | 100 kΩ | 1 | 1 | 0 | 100 kΩ | 0 v | 0.3 V | 0.3 V | TRUE | 299 µV | FALSE |
| 1 | 100 Ω | 0 | 1 | 0 | 100 kΩ | 0 v | 0.3 V | 0.3 V | TRUE | 299 µV | FALSE |
| 1 | 100 Ω | 1 | 1 | 1 | 100 Ω | 0 v | 0.3 V | 0.2 V | FALSE | 0.1 V | TRUE |

TABLE 16

| SET | | OPERATE | | WRITE | | READ | | Vth = 0.05 V | | Vth = 0.25 V |
|---|---|---|---|---|---|---|---|---|---|---|
| S | R | Y1 | Y2 | S' | R' | Vw | Vx | Vz1 | (Y1 & S) | Vz2 | ¯(Y1 & S) |
| 0 | 100 kΩ | 0 | 1 | 0 | 100 kΩ | 0.3 V | 0 v | 299 µV | FALSE | 0.3 V | TRUE |
| 0 | 100 kΩ | 1 | 1 | 0 | 100 kΩ | 0.3 V | 0 v | 299 µV | FALSE | 0.3 V | TRUE |
| 1 | 100 Ω | 0 | 1 | 0 | 100 kΩ | 0.3 V | 0 v | 299 µV | FALSE | 0.3 V | TRUE |
| 1 | 100 Ω | 1 | 1 | 1 | 100 Ω | 0.3 V | 0 v | 0.1 V | TRUE | 0.2 V | FALSE |

Further, the switching between the AND operation and OR operation in the non-destructive operation can be performed by changing the readout voltage (either Vx or Vw) and threshold voltage Vth of the output terminals Z1 and Z2, as shown in TABLE 1 and TABLE 2, for example.

The switching between the AND operation and OR operation in the operation between the external inputs can be performed by changing the readout voltage (either Vx or Vw) and threshold voltage Vth of the output terminals Z1 and Z2, as shown in TABLE 5 and TABLE 6, for example.

The switching between the AND operation and OR operation in the operation of the external input and memory data can be performed by changing the readout voltage (either Vx or Vw) and threshold voltage Vth of the output terminals Z1 and Z2, as shown in TABLE 9 and TABLE 10, for example.

Accordingly, according to this embodiment of the arithmetic circuit, the function considered to be ideal as the logic-in-memory that satisfies all of the following conditions can be obtained:

First, high voltage is not required, and the voltage about the supply voltage of the CMOS circuit is used to operate.

Secondly, both the AND (logical multiply) operation and OR (logical add) operation between the external input data and the memory data can be performed, and switching thereof can also be performed.

Thirdly, both the AND operation and the OR operation between two external input data can be performed, and the AND operation and the OR operation are switched according to the memory data.

Fourthly, the case of performing the operation without destructing the memory data and the case of preserving the result of operation as the memory data are switched according to the usage.

Further, because the variable resistance element R having the film structure shown in FIG. 2A is not dependent on the element size to obtain a high signal, and therefore has an advantage in characteristic with respect to scaling.

Further, specific settings of the external input and the clock voltage are not limited to the values mentioned above, and other various settings are possible.

Also, each resistance value of the state of high resistance and the state of low resistance of the variable resistance element R can arbitrarily be set in accordance with the configuration of film, particularly in accordance with the composition of each layer and the film thickness.

On the other hand, there is a memory element in which a material such as GeSbTe or the like is used as a recording layer and the resistance value is changed by making the recording layer change between the crystalline state and the amorphous state according to a method of applying the electric current pulse (what is called a phase-change memory element).

This phase-change memory element enables a large resistance change to be obtained, and can be used as the non-volatile device.

However, this phase-change memory element uses the temperature change as the recording principle and, for example, because the temperature that makes the transition from the amorphous state to the crystalline state (crystallization temperature) is about 200° C., there is a possibility that the action becomes considerably unstable due to the temperature change including the temperature change in the outside environment and the temperature rise when operating the device.

Also, in order to make the transition to the crystalline state it is necessary to maintain the certain temperature or more for some time (at least, over 50 nanoseconds); and therefore, the phase-change memory element is not suitable for the application to the device for the high speed logic circuit.

On the other hand, because the variable resistance element R having the film structure shown in FIG. 2A does not have the size dependency of the element, which enables a high signal to be obtained, an advantage in characteristic is obtained with respect to scaling.

In addition, such advantages are obtained that the data writing speed using the resistance change can be speeded up to be about 5 nanoseconds for example, and the low voltage (about 1V for example) and the low electric current (about 20 µA for example) are used to operate.

In the arithmetic circuit according to the embodiment described above, the function considered to be ideal as the logic-in-memory that is not obtained with the arithmetic circuit using the non-volatile device of related art can be obtained.

However, the following three points still remain to be improved:

First, because a large electric current flows in the state S=1 where the variable resistance element R is the low resistance, power consumption increases.

Secondly, because values of the ON resistance of the MOS transistor and the low resistance of the variable resistance element R become almost equal, the terminal voltages Vz1 and Vz2 at the time of readout has a value divided from the voltages Vw and Vz applied to the arithmetic circuit. Therefore, the difference in the level of voltage between the case in which the result of operation is 0 and the case in which the result of operation is 1 becomes small.

Thirdly, the values of the output voltage at the time of readout are four kinds (0V, 0.1V, 0.2V and 0.3V in the embodiment), and so two kinds of the threshold voltages (0.05V and 0.25V in the embodiment) are required to distinguish the output by 1 and 0.

Then, the configuration of arithmetic circuit to improve the above three points is shown in the followings.

FIG. 3 is a schematic configuration diagram (circuit diagram) of an arithmetic circuit according to another embodiment of the present invention.

This arithmetic circuit constitutes the above-described logic-in-memory and includes a non-volatile device and four control MOS transistors.

In the arithmetic circuit of this embodiment, specifically, two variable resistance elements R1 and R2 are connected complementarily in series as the non-volatile device.

A first variable resistance element 11 (R1), where an arrow is downward, becomes the low resistance if the voltage is applied so that the electric current flows downward, and becomes the high resistance if the voltage of reverse polarity is applied.

A second variable resistance element 12 (R2), where an arrow is upward, becomes the low resistance if the voltage is applied so that the electric current flows upward, and becomes the high resistance if the voltage of reverse polarity is applied.

Because the first variable resistance element R1 and the second variable resistance element R2 are connected in series, one of variable resistance elements becomes the low resistance and the other variable resistance element becomes the high resistance in accordance with the polarity of the voltage.

Figure 4A:
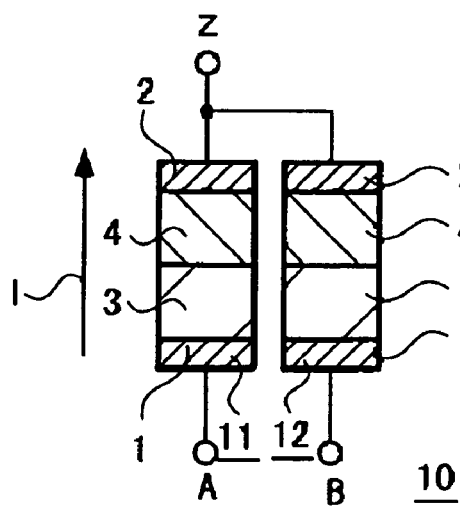
FIG. 4A is a schematic configuration diagram of a memory element used for the arithmetic circuit of FIG. 3.

The two variable resistance elements 11 (R1) and 12 (R2) may have a configuration shown in FIG. 4A. Each of the first variable resistance element 11 (R1) and the second variable resistance element 12 (R2) has the film structure in which the conductive film 3 and the insulation film 4 are provided between the electrodes 1 and 2, similarly to the variable resistance element R shown in FIG. 2A.

Figure 4B:
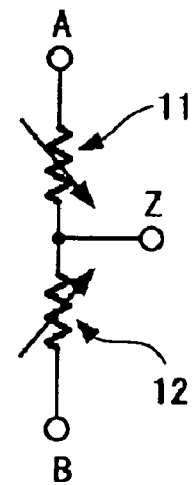
FIG. 4B is a circuit diagram of the memory element of FIG. 4A.

Further, in the two variable resistance elements 11 and 12, the electrodes 2 on the side of the insulation films 4 are connected to be the common terminal Z and the electrodes 1 on the side of the conductive films 3 are connected to the terminal A and terminal B respectively, and so a memory element 10 of the complementary three terminals is configured. With such configuration, the arrows of two variable resistance elements 11 and 12 face each other in the circuit symbol as shown in FIG. 4B.

Figure 5A:
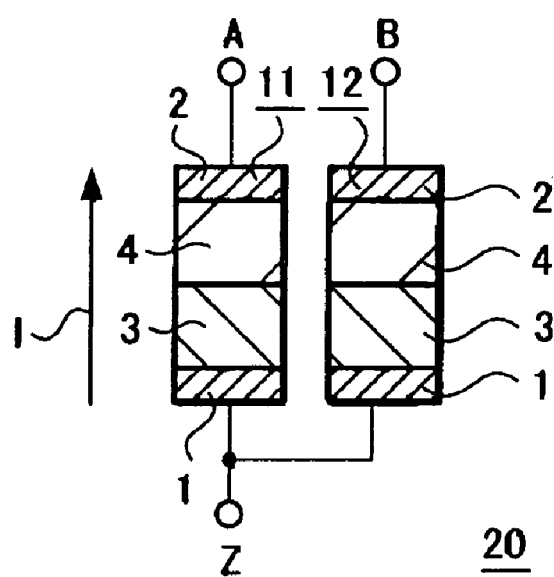
FIG. 5A is a schematic configuration diagram of a memory element of another configuration.
Figure 5B:
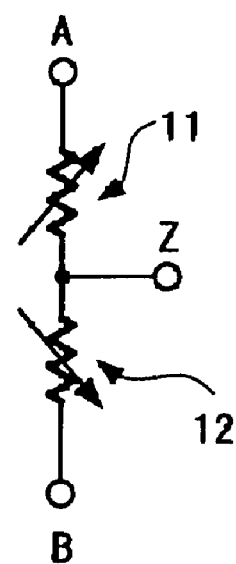
FIG. 5B is a circuit diagram of the memory element of FIG. 5A.

Further, instead of the configuration shown in FIG. 4A, as shown in FIG. 5A, in the two variable resistance elements 11 and 12, by making the electrodes 1 on the side of the conductive films 3 connected to be the common terminal Z and the electrodes 2 on the side of the insulation films 4 are connected to the terminal A and terminal B respectively, a memory element of the complementary three terminals is configured to be used. In this case, the arrows of two variable resistance elements 11 and 12 are back to back with each other, in the circuit symbol as shown in FIG. 5B.

Next, the specific action in the configuration of the memory element 10 shown in FIG. 4A is explained.

Here, the resistance value is 100 kΩ when the variable resistance elements R1 and R2 are the high resistance, and the resistance value is 100Ω when the variable resistance elements R1 and R2 are the low resistance.

First, four possible states with respect to this memory element 10 are shown in FIGS. 6A to 6D.

As shown in FIG. 6A, the state where the first resistance element 11 connected to the terminal A is the low resistance (100Ω) and the second resistance element 12 connected to the terminal B is the high resistance (100 kΩ), is defined as "state of S=1" and, as shown in FIG. 6B, the state where the first resistance element 11 connected to the terminal A is the high resistance (100 kΩ) and the second resistance element 12 connected to the terminal B is the low resistance (100 kΩ), is defined as "state of S=0".

Further, as shown in FIG. 6C, the state where both of two resistance elements 11 and 12 are the low resistances is called "intermediate state", and as shown in FIG. 6D, the state where both of two resistance elements 11 and 12 are the high resistances is called "forbidden state".

Further next, FIG. 7 shows a state transition diagram explaining the action in the case of applying the writing voltages Va and Vb to the terminal A and the terminal B in order to write the data into the memory element.

In FIG. 7, as the resistance values of the variable resistance elements 11 and 12, the value of the variable resistance elements 11 and the value of the variable resistance 12 are described in the circle of each state, the transition of each state is shown with the arrow, and the {Va, Vb}/Vz is described corresponding to these arrows as the voltage applied to each of the terminals A, B, Z respectively in the memory element 10.

First, in the case of the "state of S=1" (100Ω/100 kΩ) on the upper side of FIG. 7, the first variable resistance element 11 connected to the terminal A is the low resistance (100Ω) and the second variable resistance element 12 connected to the terminal B is the high resistance (100 kΩ). In this state, if the voltages Va=2V, Vb=0V are applied thereto, the electric current flows to the terminal B from the terminal A, then, only Vz=2.0V is obtained, because this is the stable direction for both of the low resistance of the first variable resistance element 11 and the high resistance of the second variable resistance element 12. Therefore, as shown with the arrow ({2, 0}/2) on top of the circle showing "state of S=1", the state of each variable resistance 11, 12 does not change.

Next, in the "state of S=1" (100Ω/100 kΩ), if the voltages Va=0V, Vb=2V are applied, the electric current flows to the terminal A from the terminal B, then, the potential of the terminal Z becomes Vz=0.0V, because the second variable resistance element 12 is the high resistance (100 kΩ). Hence, voltage 2v in the direction of writing is given to the second variable resistance element 12 of the high resistance, the second variable resistance element 12 changes to the low resistance (100Ω) and the "state of S=1" (100Ω/100 kΩ) on the upper side of FIG. 7 changes to the intermediate state (100Ω/100Ω) on the right side.

In this intermediate state (100Ω/100Ω), because both of the two variable resistance elements 11 and 12 are the low resistance (100Ω), voltage 2V between the terminal A and B is divided in half to be Vz=1.0V, therefore, the voltage 1V is applied to the first variable resistance element 11 in the direction of erasing. Then, the first variable resistance element 11 changes to the high resistance (100 kΩ) and accordingly the intermediate state (100Ω/100Ω) on the right side of FIG. 7 changes to the "state of S=0" (100 kΩ/100Ω) on the lower side to be the stable state of Vz=0.0V.

Similarly, in the case of the "state of S=0" (100 kΩ/100Ω) on the lower side of FIG. 7, the first variable resistance element 11 connected to the terminal A is the high resistance (100 kΩ) and the second variable resistance element 12 connected to the terminal B is the low resistance (100Ω). In this state, if the voltages Va=0V, Vb=2V are applied, the electric current flows to the terminal A from the terminal B to be only Vz=0V, because this is the stable direction for both of the low resistance of the second variable resistance element 12 and the high resistance of the first variable resistance element 11. Therefore, as shown with the arrow ({0, 2}/0) on the lower side of the circle showing "state of S=0" in FIG. 7, the state of each of the variable resistance elements 11, 12 does not change.

Next, in the "state of S=0" (100 kΩ/100Ω), if the voltages Va=2V, Vb=0V are applied, the electric current flows to the terminal B from the terminal A, then, the potential of the terminal Z becomes Vz=0.0V because the first variable resistance element 11 is the high resistance (100 kΩ). Hence, the voltage 2v in the direction of writing is given to the high resistance of the first variable resistance element 11, the first variable resistance element 11 changes to the low resistance (100Ω) and the "state of S=0" (100 kΩ/100Ω) on the lower side of FIG. 7 changes to the intermediate state (100Ω/100Ω) on the left side.

In this intermediate state (100Ω/100Ω), because both of the two variable resistance elements 11 and 12 are the low resistance (100Ω), the voltage 2V between the terminals A and B is divided in half to be Vz=1.0V, therefore, the voltage 1V is applied to the second variable resistance element 12 in the direction of erasing. Then, the second variable resistance element 12 changes to the high resistance (100 kΩ) and the intermediate state (100Ω/100Ω) on the left side of FIG. 7 changes to the "state of S=1" (100Ω/100 kΩ) on the upper side to be the stable state of Vz=2.0V.

As described above, in the memory element 10 having the configuration shown in FIG. 4A, two variable resistance elements 11 and 12 connected complementarily have the different resistance from each other, specifically the high resistance and the low resistance, so that, depending on the low resistance of the element, the memory data of either 1 or 0 is distinguished by identifying the element of the low resistance.

Further, there is a characteristic different from the action of one variable resistance element R, that is, the stable state of "state of S=1" or "state of S=0" is obtained through the unstable state "intermediate state", in the case of rewriting the data.

Further, as shown in FIG. 6D, "forbidden state", specifically the state where both of the two variable resistance elements 11 and 12 are the high resistance, becomes the initial state of the memory 10. In this state, both the variable resistance elements 11 and 12 do not become the low resistance even if 2V of difference in potential is applied to the terminals A and B on both ends.

Accordingly, it is necessary to perform the action (initialization) that makes one of or two of the non-volatile variable resistance elements 11 and 12 into the low resistance, by applying the voltage that is larger than the writing threshold value Vwr between the common terminal Z and the terminals A and B on both sides of the memory element 10. By performing this action, the memory element 10 enters the state transition cycle and the action of the data writing and the data erasing becomes possible.

In the arithmetic circuit of this embodiment, because the memory element 10 illustrated in FIG. 4, FIG. 6 and FIG. 7 is used, with respect to the memory data S, the state where the first resistance element 11 (R1) is the low resistance (100Ω) and the second resistance element 12 (R2) is the high resistance (100 kΩ) is defined as "state of S=1" and the state where the first resistance element 11 (R1) is the high resistance (100 kΩ) and the second resistance element 12 (R2) is the low resistance (100Ω) is defined as "state of S=0", as shown in FIG. 3.

Further, when the data writing threshold value of the two variable resistance elements 11 and 12 is defined as Vwr, and the data erasing threshold value is defined as Ver, Differently from the above-described formula (1), it is assumed that the following relationships are obtained:

$$0.4V < Ver < 0.5V, \ 0.4V < Vwr < 2.0V \quad (2).$$

Further, to make the explanation simplified, the ON resistance of the MOS transistor is 100Ω. Though the numerical value used here is not necessarily accurate, these are roughly proper numerical values.

In the arithmetic circuit of this embodiment, an output terminal Z is provided between the two variable resistance elements 11 and 12 and the output terminal is not provided at the terminals on both sides.

The configuration of each terminal of the control MOS transistors MRD, MRS, MW1 and MW2 and the external inputs X, W, Y1 and Y2, and each terminal of clocks CKX, CKW and CKY are similar to those of the arithmetic circuit of the previous embodiment shown in FIG. 1.

Further, the source of the MOS transistor MRD and the source of the MOS transistor MW1 are connected to one end (terminal A in FIG. 4) of the first variable resistance element 11, and the source of the MOS transistor MRS and the source of the MOS transistor MW2 are connected to one end (terminal B in FIG. 4) of the second variable resistance element 12.

Note that, although explanation was made such that a drain and a source are distinguished to be connected, either of which may be connected to the side of variable resistance elements 11 and 12, because these can be exchanged in the MOS transistor.

Furthermore, the signal given to each terminal is defined as follows:

with respect to the external input Y1, the terminal voltage Vy1=0V when Y1=0, the terminal voltage Vy1=2V when Y1=1;

with respect to the external input Y2, the terminal voltage Vy2=0V when Y2=0, the terminal voltage Vy2=2V when Y2=1;

with respect to the clock CKX, the voltage Vckx=0V when CKX=0, the voltage Vckx=1V when CKX=1;

with respect to the clock CKY, the voltage Vcky=0V when CKY=0, the voltage Vcky=1V when CKY=1;

with respect to the clock CKW, which becomes the reset input, the voltage Vckw=0V when CKW=0, the voltage Vckw=1V when CKW=1;

with respect to the external input X, the terminal voltage Vx=0.3V when X=0, the terminal voltage Vx=0.7V when X=1; and with respect to the external input W, the terminal voltage Vw=0.3V when W=0, the terminal voltage Vw=0.7V when X=1.

The basic action of the arithmetic circuit of this embodiment is such that after storing the memory data S in the memory element formed of two variable resistance elements 11 and 12 through the MOS transistor, the logical operation is performed between the external data input through any of the MOS transistors and the memory data S, and the result is output from the terminal Z (terminal voltage Vz) between the two variable resistance elements 11 and 12.

Further, as the modes of operation in the arithmetic circuit of this embodiment, two kinds of operation, that is, the non-destructive operation where the memory data S is preserved after the operation and the destructive operation where the memory data S is changed by the operation can be performed.

First, the case of performing the non-destructive operation between the external input W or the external input X and the memory data S is explained.

The procedure in this case is as follows:

Prior to the operation, the memory data S is written into the variable resistance elements 11 (R1) and 12 (R2).

Specifically, after setting as (Vy1, Vy2)=(2V, 0V) or (0V, 2V), CKY=1, CKX=CKW=0 are set.

With this, because the transistors MW1 and MW2 are turned on, and the transistors MRD and MRS are turned off, the result is (R1, R2)=(100Ω, 100 kΩ) or (100 kΩ, 100Ω), therefore, S=1 or S=0 is written as the memory data S.

Next, the operation with the external input is performed.

Specifically, after setting one of the voltages Vx and Vw as 0.7V and the other thereof as 0.3V respectively in accordance with the value (1 or 0) of the external input W or the external input X, CKY=0 CKX=CKW=1 are set.

With this, because the transistors MW1 and MW2 are turned off and the transistors MRD and MRS are turned on, two kinds of voltages 0.3V and 0.7V appear as the Vz in accordance with the combination of respective values of W, X, S.

Then, by making those binary when the threshold voltage Vth is 0.5V, the result of the logical operation of the external input X and memory data S or the logical operation of the external input W and memory data S is obtained.

TABLE 17 shows the case in which the logical operation of the external input X and the memory data S, or the logical operation of the external input W and the memory data S is performed. The result of operation of Z=⁻W&(X&S)|W&(X|⁻S) is obtained by making the threshold voltage of Vz as Vth=0.5V.

From this result of the operation, the AND operation is performed when W=0 is fixed and the X and S are computed, the OR operation is performed when W=1 is fixed and the X and S are computed, the AND operation is performed when X=0 is fixed and the W and S are computed, and the OR operation is performed when X=1 is fixed and the W and S are computed.

[TABLE 17]

TABLE 17

| INPUT | | | SET | WRITE | | | READ | | | OPERATION |
|---|---|---|---|---|---|---|---|---|---|---|
| W | X | S | Vy1 | Vy2 | R1 | R2 | Vw | Vx | Vz | Z = ¯W&(X&S) \| W&(X \| ¯S) |
| 0 | 0 | 0 | 0 v | 2 V | 100 kΩ | 100 Ω | 0.3 V | 0.3 V | 0.3 V | FALSE |
| 0 | 0 | 1 | 2 V | 0 v | 100 Ω | 100 kΩ | 0.3 V | 0.3 V | 0.3 V | FALSE |
| 0 | 1 | 0 | 0 v | 2 V | 100 kΩ | 100 Ω | 0.7 V | 0.3 V | 0.3 V | FALSE |
| 0 | 1 | 1 | 2 V | 0 v | 100 Ω | 100 kΩ | 0.7 V | 0.3 V | 0.7 V | TRUE |
| 1 | 0 | 0 | 0 v | 2 V | 100 kΩ | 100 Ω | 0.3 V | 0.7 V | 0.7 V | TRUE |
| 1 | 0 | 1 | 2 V | 0 v | 100 Ω | 100 kΩ | 0.3 V | 0.7 V | 0.3 V | FALSE |
| 1 | 1 | 0 | 0 v | 2 V | 100 kΩ | 100 Ω | 0.7 V | 0.7 V | 0.7 V | TRUE |
| 1 | 1 | 1 | 2 V | 0 v | 100 Ω | 100 kΩ | 0.7 V | 0.7 V | 0.7 V | TRUE |

In this embodiment, the value of the output terminal voltage Vz becomes two kinds because the memory element 10 of three terminals formed of the two variable resistance elements 11 and 12 is used, and since the logical operation of $$Z = \bar{W}\&(X\&S) | W\&(X|\bar{S})$$

can be performed in accordance with the combination of respective values of W, X, S, it becomes easy to be handled in comparison with the arithmetic circuit of the previous embodiment.

Next, the case of performing the destructive operation between the external inputs Y1 and Y2 and the memory data S is explained.

The procedure in this case is as follows:

Prior to the operation, the memory data S is written into the variable resistance elements 11 (R1) and 12 (R2).

Specifically, after setting as (Vx, Vw)=(2V, 0V) or (0V, 2V), CKY=0, CKX=CKW=1 are set.

With this, because the transistors MW1 and MW2 are turned off, and the transistors MRD and MRS are turned on, the result is (R1, R2)=(100Ω, 100 kΩ) or (R1, R2)=(100 kΩ, 100Ω), therefore, S=1 or S=0 is written in as the memory data S.

Next, the operation of the external inputs Y1 and Y2 is performed.

Specifically, after setting the external input Y1 and the external input Y2 as either 1 or 0 respectively (any of the combination of four kinds), CKY=1, CKX=CKW=0 are set.

With this, because the transistors MW1 and MW2 are turned on and the transistors MRD and MRS are turned off, the voltage applied to both ends of the variable resistance elements 11 and 12 changes in accordance with the combination of the values of Y1 and Y2.

Further, the resistance values R1 and R2 of the variable resistance elements 11 and 12 are changed by one kind among four kinds of combination (depending on the content of the memory data S), and the value of the memory data S is rewritten.

Next, the result of operation is read out.

Specifically, after setting as (Vx, Vw)=(0.3V, 0.7V) or (0.7V, 0.3V), CKY=0, CKX=CKW=1 are set.

With this, because the transistors MW1 and MW2 are turned off and the transistors MRD and MRS are turned on, two kinds of voltages 0.3V and 0.7V appear as the Vz in accordance with the combination of respective values of Y1, Y2, S.

Further, by making those binary when threshold voltage Vth is 0.5v, the results of the logical operation between the external input Y1 and Y2, of the logical operation of the external input Y1 and memory data S and of the logical operation of the external input Y2 and memory data S are obtained.

Four tables from TABLE 18 to TABLE 21 show the various combinations in the case of performing the logical operation (destructive operation) between two external inputs Y1 and Y2.

TABLE 18 shows the case in which the memory data is set as S=0, the operation between the two external inputs Y1 and Y2 is performed and the result of operation is read out with Vx=0.7V and Vw=0.3V. In this case, the result of operation of Z=Y1&¯Y2 is obtained by making the threshold of Vz as Vth=0.5V.

TABLE 19 shows the case in which the memory data is set as S=0, the operation between the two external inputs Y1 and Y2 is performed and the result of operation is read out with Vx=0.3V and Vw=0.7V. In this case, the result of operation of Z=¯Y1|Y2 is obtained by making the threshold of Vz as Vth=0.5V.

TABLE 20 shows the case in which the memory data is set as S=1, the operation between the two external inputs Y1 and Y2 is performed and the result of operation is read out with Vx=0.7V and Vw=0.3V. In this case, the result of operation of Z=Y1|¯Y2 is obtained by making the threshold of Vz as Vth=0.5V.

TABLE 21 shows the case in which the memory data is set as S=1, the operation between the two external inputs Y1 and Y2 is performed and the result of operation is read out with Vx=0.3V and Vw=0.7V. In this case, the result of operation of Z=¯Y1&Y2 is obtained by making the threshold of Vz as Vth=0.5V.

[TABLE 18, TABLE 19, TABLE 20 and TABLE 21]

TABLE 18

| SET | | | OPERATE | | WRITE | | | READ | | | Vth = 0.5 V |
|---|---|---|---|---|---|---|---|---|---|---|---|
| S | R1 | R2 | Y1 | Y2 | S' | R1' | R2' | Vw | Vx | Vz | Y1 & ~Y2 |
| 0 | 100 kΩ | 100 Ω | 0 | 0 | 0 | 100 kΩ | 100 Ω | 0.7 V | 0.3 V | 0.3 V | FALSE |
| 0 | 100 kΩ | 100 Ω | 0 | 1 | 0 | 100 kΩ | 100 Ω | 0.7 V | 0.3 V | 0.3 V | FALSE |
| 0 | 100 kΩ | 100 Ω | 1 | 0 | 1 | 100 Ω | 100 kΩ | 0.7 V | 0.3 V | 0.7 V | TRUE |
| 0 | 100 kΩ | 100 Ω | 1 | 1 | 0 | 100 kΩ | 100 Ω | 0.7 V | 0.3 V | 0.3 V | FALSE |

TABLE 19

| SET | | | OPERATE | | WRITE | | | READ | | | Vth = 0.5 V |
|---|---|---|---|---|---|---|---|---|---|---|---|
| S | R1 | R2 | Y1 | Y2 | S' | R1' | R2' | Vw | Vx | Vz | ~Y1 \| Y2 |
| 0 | 100 kΩ | 100 Ω | 0 | 0 | 0 | 100 kΩ | 100 Ω | 0.3 V | 0.7 V | 0.7 V | TRUE |
| 0 | 100 kΩ | 100 Ω | 0 | 1 | 0 | 100 kΩ | 100 Ω | 0.3 V | 0.7 V | 0.7 V | TRUE |
| 0 | 100 kΩ | 100 Ω | 1 | 0 | 1 | 100 Ω | 100 kΩ | 0.3 V | 0.7 V | 0.3 V | FALSE |
| 0 | 100 kΩ | 100 Ω | 1 | 1 | 0 | 100 kΩ | 100 Ω | 0.3 V | 0.7 V | 0.7 V | TRUE |

TABLE 20

| SET | | | OPERATE | | WRITE | | | READ | | | Vth = 0.5 V |
|---|---|---|---|---|---|---|---|---|---|---|---|
| S | R1 | R2 | Y1 | Y2 | S' | R1' | R2' | Vw | Vx | Vz | Y1 \| ~Y2 |
| 1 | 100 Ω | 100 kΩ | 0 | 0 | 1 | 100 Ω | 100 kΩ | 0.7 V | 0.3 V | 0.7 V | TRUE |
| 1 | 100 Ω | 100 kΩ | 0 | 1 | 0 | 100 kΩ | 100 Ω | 0.7 V | 0.3 V | 0.3 V | FALSE |
| 1 | 100 Ω | 100 kΩ | 1 | 0 | 1 | 100 Ω | 100 kΩ | 0.7 V | 0.3 V | 0.7 V | TRUE |
| 1 | 100 Ω | 100 kΩ | 1 | 1 | 1 | 100 Ω | 100 kΩ | 0.7 V | 0.3 V | 0.7 V | TRUE |

TABLE 21

| SET | | | OPERATE | | WRITE | | | READ | | | Vth = 0.5 V |
|---|---|---|---|---|---|---|---|---|---|---|---|
| S | R1 | R2 | Y1 | Y2 | S' | R1' | R2' | Vw | Vx | Vz | ~Y1 & Y2 |
| 1 | 100 Ω | 100 kΩ | 0 | 0 | 1 | 100 Ω | 100 kΩ | 0.3 V | 0.7 V | 0.3 V | FALSE |
| 1 | 100 Ω | 100 kΩ | 0 | 1 | 0 | 100 kΩ | 100 Ω | 0.3 V | 0.7 V | 0.7 V | TRUE |
| 1 | 100 Ω | 100 kΩ | 1 | 0 | 1 | 100 Ω | 100 kΩ | 0.3 V | 0.7 V | 0.3 V | FALSE |
| 1 | 100 Ω | 100 kΩ | 1 | 1 | 1 | 100 Ω | 100 kΩ | 0.3 V | 0.7 V | 0.3 V | FALSE |

The four tables from TABLE 22 to TABLE 25 show the various combinations in the case of performing the logical operation (destructive operation) of the external inputs Y2 and the memory data S.

TABLE 22 shows the case in which Y1=0 is fixed, the operation between the external input Y2 and the memory data S is performed and the result of operation is read out with Vx=0.7V and Vw=0.3V. In this case, the result of operation of Z=S&~Y2 is obtained by making the threshold of Vz as Vth=0.5V.

TABLE 23 shows the case in which Y1=0 is fixed, the operation between the external input Y2 and the memory data S is performed and the result of operation is read out with Vx=0.3V and Vw=0.7V. In this case, the result of operation of Z=~S|Y2 is obtained by making the threshold of Vz as Vth=0.5V.

TABLE 24 shows the case in which Y1=1 is fixed, the operation between the external input Y2 and the memory data S is performed and the result of operation is read out with Vx=0.7V and Vw=0.3V. In this case, the result of operation of Z=S|~Y2 is obtained by making the threshold of Vz as Vth=0.5V.

TABLE 25 shows the case in which Y1=1 is fixed, the operation between the external input Y2 and the memory data S is performed and the result of operation is read out with Vx=0.3V and Vw=0.7V. In this case, the result of operation of Z=~S&Y2 is obtained by making the threshold of Vz as Vth=0.5V.

[TABLE 22, TABLE 23, TABLE 24 and TABLE 25]

TABLE 22

| SET | | | OPERATE | | WRITE | | | READ | | | Vth = 0.5 V |
|---|---|---|---|---|---|---|---|---|---|---|---|
| S | R1 | R2 | Y1 | Y2 | S' | R1' | R2' | Vw | Vx | Vz | S & ~Y2 |
| 0 | 100 kΩ | 100 Ω | 0 | 0 | 0 | 100 kΩ | 100 Ω | 0.7 V | 0.3 V | 0.3 V | FALSE |
| 0 | 100 kΩ | 100 Ω | 0 | 1 | 0 | 100 kΩ | 100 Ω | 0.7 V | 0.3 V | 0.3 V | FALSE |
| 1 | 100 Ω | 100 kΩ | 0 | 0 | 1 | 100 Ω | 100 kΩ | 0.7 V | 0.3 V | 0.7 V | TRUE |
| 1 | 100 Ω | 100 kΩ | 0 | 1 | 0 | 100 kΩ | 100 Ω | 0.7 V | 0.3 V | 0.3 V | FALSE |

TABLE 23

| SET | | | OPERATE | | WRITE | | | READ | | | Vth = 0.5 V |
|---|---|---|---|---|---|---|---|---|---|---|---|
| S | R1 | R2 | Y1 | Y2 | S' | R1' | R2' | Vw | Vx | Vz | ~S \| Y2 |
| 0 | 100 kΩ | 100 Ω | 0 | 0 | 0 | 100 kΩ | 100 Ω | 0.3 V | 0.7 V | 0.7 V | TRUE |
| 0 | 100 kΩ | 100 Ω | 0 | 1 | 0 | 100 kΩ | 100 Ω | 0.3 V | 0.7 V | 0.7 V | TRUE |
| 1 | 100 Ω | 100 kΩ | 0 | 0 | 1 | 100 Ω | 100 kΩ | 0.3 V | 0.7 V | 0.3 V | FALSE |
| 1 | 100 Ω | 100 kΩ | 0 | 1 | 0 | 100 kΩ | 100 Ω | 0.3 V | 0.7 V | 0.7 V | TRUE |

TABLE 24

| SET | | | OPERATE | | WRITE | | | READ | | | Vth = 0.5 V |
|---|---|---|---|---|---|---|---|---|---|---|---|
| S | R1 | R2 | Y1 | Y2 | S' | R1' | R2' | Vw | Vx | Vz | S \| ~Y2 |
| 0 | 100 kΩ | 100 Ω | 1 | 0 | 1 | 100 Ω | 100 kΩ | 0.7 V | 0.3 V | 0.7 V | TRUE |
| 0 | 100 kΩ | 100 Ω | 1 | 1 | 0 | 100 kΩ | 100 Ω | 0.7 V | 0.3 V | 0.3 V | FALSE |
| 1 | 100 Ω | 100 kΩ | 1 | 0 | 1 | 100 Ω | 100 kΩ | 0.7 V | 0.3 V | 0.7 V | TRUE |
| 1 | 100 Ω | 100 kΩ | 1 | 1 | 1 | 100 Ω | 100 kΩ | 0.7 V | 0.3 V | 0.7 V | TRUE |

TABLE 25

| SET | | | OPERATE | | WRITE | | | READ | | | Vth = 0.5 V |
|---|---|---|---|---|---|---|---|---|---|---|---|
| S | R1 | R2 | Y1 | Y2 | S' | R1' | R2' | Vw | Vx | Vz | ~S & Y2 |
| 0 | 100 kΩ | 100 Ω | 1 | 0 | 1 | 100 Ω | 100 kΩ | 0.3 V | 0.7 V | 0.3 V | FALSE |
| 0 | 100 kΩ | 100 Ω | 1 | 1 | 0 | 100 kΩ | 100 Ω | 0.3 V | 0.7 V | 0.7 V | TRUE |
| 1 | 100 Ω | 100 kΩ | 1 | 0 | 1 | 100 Ω | 100 kΩ | 0.3 V | 0.7 V | 0.3 V | FALSE |
| 1 | 100 Ω | 100 kΩ | 1 | 1 | 1 | 100 Ω | 100 kΩ | 0.3 V | 0.7 V | 0.3 V | FALSE |

The four tables from TABLE 26 to TABLE 29 show the various combinations in the case of performing the logical operation (destructive operation) of the external inputs Y1 and the memory data S.

TABLE 26 shows the case in which Y2=1 is fixed, the operation between the external input Y1 and the memory data S is performed and the result of operation is read out with Vx=0.7V and Vw=0.3V. In this case, the result of operation of Z=S&Y1 is obtained by making the threshold of Vz as Vth=0.5V.

TABLE 27 shows the case in which Y2=1 is fixed, the operation between the external input Y1 and the memory data S is performed and the result of operation is read out with Vx=0.3V and Vw=0.7V. In this case, the result of operation of Z=~S|~Y1 is obtained by making the threshold of Vz as Vth=0.5V.

TABLE 28 shows the case in which Y2=0 is fixed, the operation between the external input Y1 and the memory data S is performed and the result of operation is read out with Vx=0.7V and Vw=0.3V. In this case, the result of operation of Z=S|Y1 is obtained by making the threshold of Vz as Vth=0.5V.

TABLE 29 shows the case in which Y2=0 is fixed, the operation between the external input Y1 and the memory data S is performed and the result of operation is read out with Vx=0.3V and Vw=0.7V. In this case, the result of operation of Z=~S&~Y1 is obtained by making the threshold of Vz as Vth=0.5V.

[TABLE 26, TABLE 27, TABLE 28 and TABLE 29]

TABLE 26

| SET | | | OPERATE | | WRITE | | | READ | | | Vth = 0.5 V |
|---|---|---|---|---|---|---|---|---|---|---|---|
| S | R1 | R2 | Y1 | Y2 | S' | R1' | R2' | Vw | Vx | Vz | S & Y1 |
| 0 | 100 kΩ | 100 Ω | 0 | 1 | 0 | 100 kΩ | 100 Ω | 0.7 V | 0.3 V | 0.3 V | FALSE |
| 0 | 100 kΩ | 100 Ω | 1 | 1 | 0 | 100 kΩ | 100 Ω | 0.7 V | 0.3 V | 0.3 V | FALSE |
| 1 | 100 Ω | 100 kΩ | 0 | 1 | 0 | 100 kΩ | 100 Ω | 0.7 V | 0.3 V | 0.3 V | FALSE |
| 1 | 100 Ω | 100 kΩ | 1 | 1 | 1 | 100 Ω | 100 kΩ | 0.7 V | 0.3 V | 0.7 V | TRUE |

TABLE 27

| SET | | | OPERATE | | WRITE | | | READ | | | Vth = 0.5 V |
|---|---|---|---|---|---|---|---|---|---|---|---|
| S | R1 | R2 | Y1 | Y2 | S' | R1' | R2' | Vw | Vx | Vz | ~S \| ~Y1 |
| 0 | 100 kΩ | 100 Ω | 0 | 1 | 0 | 100 kΩ | 100 Ω | 0.3 V | 0.7 V | 0.7 V | TRUE |
| 0 | 100 kΩ | 100 Ω | 1 | 1 | 0 | 100 kΩ | 100 Ω | 0.3 V | 0.7 V | 0.7 V | TRUE |
| 1 | 100 Ω | 100 kΩ | 0 | 1 | 0 | 100 kΩ | 100 Ω | 0.3 V | 0.7 V | 0.7 V | TRUE |
| 1 | 100 Ω | 100 kΩ | 1 | 1 | 1 | 100 Ω | 100 kΩ | 0.3 V | 0.7 V | 0.3 V | FALSE |

TABLE 28

| SET | | | OPERATE | | WRITE | | | READ | | | Vth = 0.5 V |
|---|---|---|---|---|---|---|---|---|---|---|---|
| S | R1 | R2 | Y1 | Y2 | S' | R1' | R2' | Vw | Vx | Vz | S \| Y1 |
| 0 | 100 kΩ | 100 Ω | 0 | 0 | 0 | 100 kΩ | 100 Ω | 0.7 V | 0.3 V | 0.3 V | FALSE |
| 0 | 100 kΩ | 100 Ω | 1 | 0 | 1 | 100 Ω | 100 kΩ | 0.7 V | 0.3 V | 0.7 V | TRUE |
| 1 | 100 Ω | 100 kΩ | 0 | 0 | 1 | 100 Ω | 100 kΩ | 0.7 V | 0.3 V | 0.7 V | TRUE |
| 1 | 100 Ω | 100 kΩ | 1 | 0 | 1 | 100 Ω | 100 kΩ | 0.7 V | 0.3 V | 0.7 V | TRUE |

TABLE 29

| SET | | | OPERATE | | WRITE | | | READ | | | Vth = 0.5 V |
|---|---|---|---|---|---|---|---|---|---|---|---|
| S | R1 | R2 | Y1 | Y2 | S' | R1' | R2' | Vw | Vx | Vz | ~S & ~Y1 |
| 0 | 100 kΩ | 100 Ω | 0 | 0 | 0 | 100 kΩ | 100 Ω | 0.3 V | 0.7 V | 0.7 V | TRUE |
| 0 | 100 kΩ | 100 Ω | 1 | 0 | 1 | 100 Ω | 100 kΩ | 0.3 V | 0.7 V | 0.3 V | FALSE |
| 1 | 100 Ω | 100 kΩ | 0 | 0 | 1 | 100 Ω | 100 kΩ | 0.3 V | 0.7 V | 0.3 V | FALSE |
| 1 | 100 Ω | 100 kΩ | 1 | 0 | 1 | 100 Ω | 100 kΩ | 0.3 V | 0.7 V | 0.3 V | FALSE |

According to the configuration of the arithmetic circuit of this embodiment, because the arithmetic circuit having the arithmetic unit and memory element is formed of the variable resistance elements 11 and 12 as the non-volatile device, the arithmetic circuit can operate at a high speed and can be made small, similarly to the arithmetic circuit of the previous embodiment shown in FIG. 1.

Further, with the characteristic of the variable resistance elements 11 and 12, the resistance values of the variable resistance elements 11 and 12 are made to change with a comparatively low voltage (about 2V for example) to write the memory data S.

Further, all the non-destructive operation, the operation between the external inputs, and the operation of the external input and the memory data can be performed, and the AND (logical multiply) operation and the OR (logical add) operation can be performed with respect to the above operations.

Also, the switching between the AND operation and OR operation in the non-destructive operation can be performed easily by changing one of the external inputs (X or W) in TABLE 17, for example.

The switching between the AND operation and OR operation in the operation between the external inputs can be performed easily by changing the voltage at readout time (Vx and Vw) as shown in TABLEs 18 and 19, for example.

The switching between the AND operation and OR operation in the operation of the external input and memory data can also be performed easily by changing the voltage at readout time (Vx and Vw) as shown in TABLEs 22 and 23, for example.

In the arithmetic circuit of this embodiment, the switching can be performed easily because there is no need to change the threshold voltage Vth of the output Z for switching between the AND operation and the OR operation in these operations.

Consequently, according to the arithmetic circuit of this embodiment, the function considered to be ideal as the logic-in-memory that satisfies all of the following conditions can be obtained:

First, high voltage is not required, and the voltage about the supply voltage of the CMOS circuit is used to operate.

Secondly, both the AND (logical multiply) operation and OR (logical add) operation between the external input data and the memory data can be performed, and switching thereof can also be performed.

Thirdly, both the AND operation and the OR operation between two external input data can be performed, and the AND operation and the OR operation are switched according to the memory data.

Fourthly, the case of performing the operation without destructing the memory data, and the case of preserving the result of operation as the memory data are switched according to the usage.

Further, according to the arithmetic circuit of this embodiment, because the memory element of three terminals, in which two variable resistance elements 11 and 12 are complementarily connected, is used, the composite resistance of the two variable resistance elements 11 and 12 becomes a high and constant value, regardless of the contents of memory data S, therefore the power consumption is small.

Also, because the ON resistance of MOS transistors MRD and MRS (about 100Ω, for example) becomes sufficiently small in comparison with the composite resistance of the two variable resistance elements 11 and 12, the readout voltage is not divided by the MOS transistors MRD and MRS, therefore the difference in the output voltage level between 1 and 0 is large.

Furthermore, because the value of the output voltage Vz is two kinds, only one kind of threshold voltage (0.5V, for example) for distinguishing 1 and 0 of the result of operation is needed.

Furthermore, the AND operation and the OR operation can be switched easily only by changing the voltage at readout time, in other words, by corresponding software without changing the threshold voltage.

Accordingly, three points mentioned above can be improved with respect to the arithmetic circuit of the previous embodiment shown in FIG. 1.

Note that, the specific settings of the external input and clock voltages are not limited to the above values explained, and various other settings can be provided.

Further, each resistance value in the state of high resistance and state of low resistance of the variable resistance R may arbitrarily be set in accordance with the film structure, particularly in accordance with the composition of each layer and thickness of film.

In each arithmetic circuit of the above-described embodiments, four control MOS transistors are used to constitute the arithmetic circuit.

On the other hand, by decreasing the control MOS transistors by two, the arithmetic circuit with the same action may also be configured Specifically, because two MOS transistors MRD and MRS are turned on simultaneously in each arithmetic circuit of the above-described embodiments, the clock CKX and clock CKW input to these gates can be made common. In addition, since the MOS transistors MRD and MRS and the MOS transistors MW1 and MW2 are exclusively turned on or off, those can be made common.

Therefore, the similar action can be obtained, even if the MOS transistors MRD and MRS are not provided and only two MOS transistors MW1 and MW2 are provided with only one input clock to the gate.

Figure 8:
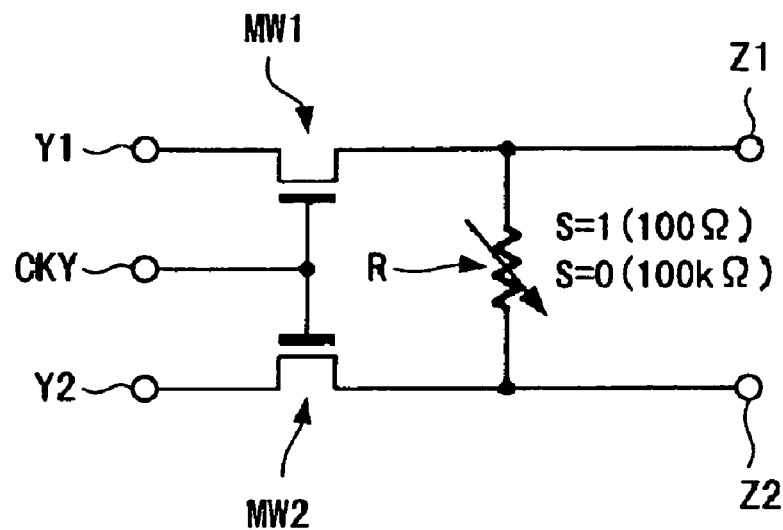
FIG. 8 is a schematic configuration diagram (circuit diagram) of a modified arithmetic circuit of the arithmetic circuit of FIG. 1.

FIG. 8 shows a schematic configuration diagram of an arithmetic circuit having such simplified configuration in comparison with the arithmetic circuit shown in FIG. 1.

In the arithmetic circuit shown in FIG. 8, only two control MOS transistors MW1 and MW2 are provided without providing the MOS transistors MRD and MRS and input terminals X, CKX, W and CKW to the gates and drains thereof. Because the other configuration is the same as FIG. 1, the same reference numerals are given and redundant explanations are omitted.

Further, with respect to the data writing threshold value Vwr and the data erasing threshold value Ver of the variable resistance element R in FIG. 8, it is assumed that the following relationships be obtained:

$$0.3V<Ver<1.0V, 0.3V<Vwr<1.0V \tag{1}$$

In the arithmetic circuit shown in FIG. 8, the modes of operation are the same as the arithmetic circuit shown in FIG. 1, and the action procedure is almost the same as the arithmetic circuit shown in FIG. 1.

The procedure in the case of performing the non-destructive operation between the external input Y1 or the external input Y2 and the memory data S, is as follows:

Prior to the operation, the memory data S is written into the variable resistance element R.

Specifically, after setting as (Vy1, Vy2)=(1V, 0V) or (0V, 1V), CKY=1 is set. With this, because the transistors MW1 and MW2 are turned on, the result is R=100Ω or 100 kΩ, therefore, S=1 or S=0 is written as the memory data S.

Next, the operation with the external input is performed.

Specifically, after setting one of the voltages Vy1 and Vy2 as 0.3V and the other thereof as 0.0V respectively, CKY=1 is set in accordance with the value (1 or 0) of the external input Y1 or the external input Y2.

With this, because the transistors MW1 and MW2 are turned on, four kinds of voltages 0V, 0.1V, 0.2V and 0.3V appear as the Vz1 and Vz2 in accordance with the combination of respective values of Y1, Y2, S.

Further, by making those binary when the threshold voltage Vth is 0.05V or 0.25, the result of the logical operation of the external input Y1 and memory data S or of the logical operation of the external input Y2 and memory data S, is obtained.

In the case of performing this non-destructive operation, the same result as the case in which X (Vx) is replaced with Y1 (Vy1) and W (Vw) is replaced with Y2 (Vy2) in each of TABLEs 1 to 4 of the arithmetic circuit in FIG. 1, is obtained.

Next, the procedure of the case in which the destructive operation is performed between the external input Y1 or the external input Y2 and the memory data S, is as follows:

Prior to the operation, the memory data S is written into the variable resistance element R.

Specifically, after setting as (Vy1, Vy2)=(1V, 0V) or (0V, 1V), CKY=1 is set.

With this, because the transistors MW1 and MW2 are turned on, the result is R=100Ω or 100 kΩ, therefore, S=1 or S=0 is written as the memory data S.

Next, the operation of the external inputs Y1 and Y2 is performed.

Specifically, after setting the external input Y1 and the external input Y2 as either 1 or 0 (any of the combination of four kinds), CKY=1 is set.

With this, because the transistors MW1 and MW2 are turned on, the voltage applied to both ends of the variable resistance element R changes in accordance with the combination of the values of Y1 and Y2.

Then, the resistance value of the variable resistance element R is changed by one kind among four kinds of combination (depending on the content of the memory data S), and the value of the memory data S is rewritten.

Further, the result of operation is read out.

Specifically, after setting as (Vy1, Vy2)=(0.0V, 0.3V) or (0.3V, 0.0V), CKY=1 is set.

With this, because the transistors MW1 and MW2 are turned on, four kinds of voltages 0V, 0.1V, 0.2V and 0.3V appear as the Vz1 and Vz2 in accordance with the combination of respective values of Y1, Y2, S.

Further, by making those binary when the threshold voltage Vth is 0.05V or 0.25, the results of the logical operation between the external input Y1 and Y2, the logical operation of the external input Y1 and memory data S and the logical operation of the external input Y2 and memory data S are obtained.

In the case of performing this destructive operation, the same result as the case in which X (Vx) is replaced with Y1 (Vy1) and W (Vw) is replaced with Y2 (Vy2) in each of TABLEs 5 to 16 of the arithmetic circuit in FIG. 1, is obtained.

As mentioned above, because the same operational result as the arithmetic circuit shown in FIG. 1 is obtained, the function considered to be ideal as the logic-in-memory that satisfies all the following conditions can be obtained with the arithmetic circuit shown in FIG. 8, similarly to the arithmetic circuit shown in FIG. 1:

First, high voltage is not required, and the voltage about the supply voltage of the CMOS circuit is used to operate.

Secondly, both the AND (logical multiply) operation and OR (logical add) operation between the external input data and the memory data can be performed, and switching thereof can also be performed.

Thirdly, both the AND operation and the OR operation between two external input data can be performed, and the AND operation and the OR operation are switched according to the memory data.

Fourthly, the case of performing the operation without destructing the memory data and the case of preserving the result of operation as the memory data are switched according to the usage.

Further, the area efficiency can be improved because the number of MOS transistor is reduced by two.

However, it is necessary to manage the timing of the external input in the configuration shown in FIG. 8.

With respect to the configuration shown in FIG. 1, if the clock CKY is inverted to be used as the clocks CKX and CKW, two pieces of MOS transistor can be operated alternately, and the input timing for the external inputs X, W, Y1 and Y2 may not require the preciseness.

On the other hand, with respect to the configuration shown in FIG. 8, because the number of the control transistors is reduced and the clock CKY of the gate is made common, control is needed to make the timing of the change of the voltages Vy1 and Vy2 of the external inputs Y1 and Y2 meet the period of clock CKY=0 (period when the MOS transistors MW1 and MW2 are off).

Therefore, either configuration can be selected to use by giving the priority to either the simplification of the circuit configuration or the easiness in control.

Figure 9:
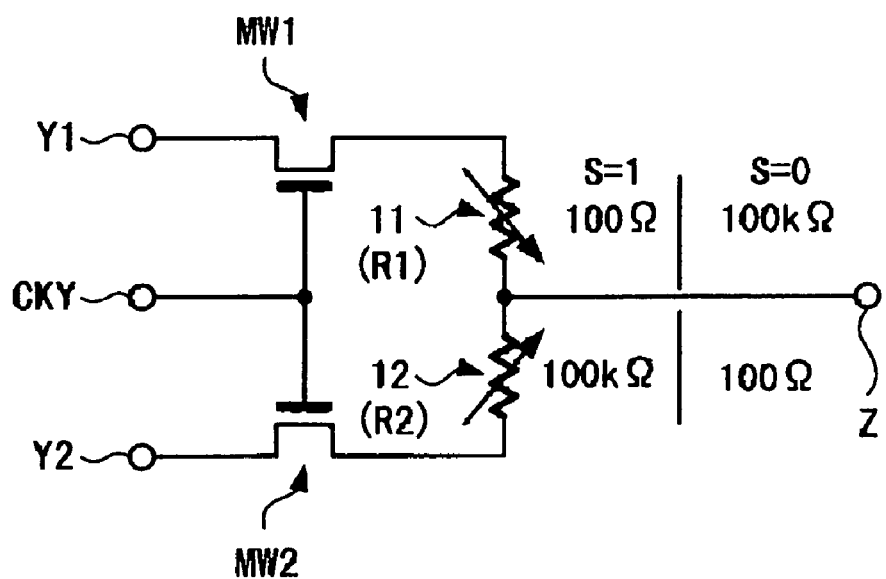
FIG. 9 is a schematic configuration diagram (circuit diagram) of a modified arithmetic circuit of the arithmetic circuit of FIG. 3.

Next, FIG. 9 shows a schematic configuration diagram of an arithmetic circuit similarly having configuration simplified in comparison with the arithmetic circuit shown in FIG. 3.

In the arithmetic circuit shown in FIG. 9, only two control MOS transistors MW1 and MW2 are provided without providing the MOS transistors MRD and MRS and input terminals X, CKX, W and CKW to the gates and drains thereof. Because the other configuration is the same as FIG. 3, the same reference numerals are given and redundant explanations are omitted.

Further, with respect to the data writing threshold value Vwr and the data erasing threshold value Ver of the variable resistance element R in FIG. 9, it is assumed that the following relationships be obtained:

$$0.4V < Ver < 0.5V, 0.4V < Vwr < 2.0V \qquad (2)$$

In the arithmetic circuit shown in FIG. 9, the modes of operation are the same as the arithmetic circuit shown in FIG. 3, and the action procedure is almost the same as the arithmetic circuit shown in FIG. 3.

The procedure in the case of performing the non-destructive operation between the external input Y1 or the external input Y2 and the memory data S, is as follows:

Prior to the operation, the memory data S is written into the variable resistance elements 11 (R1) and 12 (R2).

Specifically, after setting as (Vy1, Vy2)=(2V, 0V) or (0V, 2V), CKY=1 is set.

With this, because the transistors MW1 and MW2 are turned on, the result is (R1, R2)=(100Ω, 100 kΩ) or (100 kΩ, 100Ω), therefore, S=1 or S=0 is written as the memory data S.

Next, the operation with the external input is performed.

Specifically, after setting one of the voltages Vy1 and Vy2 as 0.7V and the other thereof as 0.3V respectively in accordance with the value (1 or 0) of the external input y1 or the external input y2, CKY=1 is set.

With this, because the transistors MW1 and MW2 are turned on, two kinds of voltages 0.3V and 0.7V appear as the Vz in accordance with the combination of respective values of Y1, Y2, S.

Further, by making those binary when the threshold voltage Vth is 0.5V, the result of the logical operation of the external input Y1 and memory data S or the result of the logical operation of the external input Y2 and memory data S, is obtained.

In the case of performing this non-destructive operation, the same result as the case in which X (Vx) is replaced with Y1 (Vy1) and W (Vw) is replaced with Y2 (Vy2) in the TABLE 17 of the arithmetic circuit in FIG. 3, is obtained.

Further, in the arithmetic circuit shown in FIG. 9, the value of the output terminal voltage Vz is two kinds because the memory element of three terminals is used, and since the logical operation of $$Z = \overline{Y2} \& (Y1 \& S) | Y2 \& (Y1 | \overline{S})$$

can be performed in accordance with the combination of respective values Y1, Y2, S, handling the circuit becomes easy in comparison with the arithmetic circuit shown in FIG. 8.

Next, the procedure of the case in which the destructive operation is performed between the external inputs Y1, Y2 and the memory data S is as follows:

Prior to the operation, the memory data S is written into the variable resistance elements 11 (R1) and 12 (R2).

Specifically, after setting as (Vy1, Vy2)=(2V, 0V) or (0V, 2V), CKY=1 is set.

With this, because the transistors MW1 and MW2 are turned on, the result is (R1, R2)=(100Ω, 100 kΩ) or (100 kΩ, 100Ω), therefore, S=1 or S=0 is written as the memory data S.

Next, the operation of the external inputs Y1 and Y2 is performed.

Specifically, after setting the external input Y1 and the external input Y2 as either 1 or 0 respectively (any of the combination of four kinds), CKY=1 is set.

With this, because the transistors MW1 and MW2 are turned on, the voltage applied to both ends of the variable resistance elements 11 (R1) and 12 (R2) changes in accordance with the combination of the values of Y1 and Y2.

Further, the resistance value of the variable resistance elements 11 and 12 is changed by one kind among four kinds of combination (depending on the content of the memory data S), and the value of the memory data S is rewritten.

Further next, the result of operation is read out.

Specifically, after setting as (Vy1, Vy2)=(0.3V, 0.7V) or (0.7V, 0.3V), CKY=1 is set.

With this, because the transistors MW1 and MW2 are turned on, two kinds of voltages 0.3V and 0.7V appear as the Vz in accordance with the combination of respective values of Y1, Y2, S.

Further, by making those binary when the threshold voltage Vth is 0.5V, the results of the logical operation between the external input Y1 and Y2, of the logical operation of the external input Y1 and memory data S and of the logical operation of the external input Y2 and memory data S are obtained.

In the case of performing this destructive operation, the same result as the case in which X (Vx) is replaced with Y1 (Vy1) and W (Vw) is replaced with Y2 (Vy2) in each of TABLEs 18 to 29 of the arithmetic circuit in FIG. 3, is obtained.

As mentioned above, because the same result of operation as the arithmetic circuit shown in FIG. 3 is obtained, the function considered to be ideal as the logic-in-memory that satisfies all of the following conditions can be obtained with the arithmetic circuit shown in FIG. 9, similarly to the arithmetic circuit shown in FIG. 3:

First, high voltage is not required, and the voltage about the supply voltage of the CMOS circuit is used to operate.

Secondly, both the AND (logical multiply) operation and OR (logical add) operation between the external input data and the memory data can be performed, and switching thereof can also be performed.

Thirdly, both the AND operation and the OR operation between two external input data can be performed, and the AND operation and the OR operation are switched according to the memory data.

Fourthly, the case of performing the operation without destructing the memory data, and the case of preserving the result of operation as the memory data are switched according to the usage.

Further, because the memory element having three terminals, in which two variable resistance elements 11 and 12 are complementarily connected, is used, the composite resistance of two variable resistance elements 11 and 12 becomes a high and constant resistance value regardless of the contents of memory data S, therefore the power consumption is small.

Further, because the ON resistance (about 100Ω, for example) of MOS transistors MRD and MRS becomes sufficiently small in comparison with the composite resistance of two variable resistance elements 11 and 12, the readout voltage is not divided by the MOS transistors MRD and MRS, therefore the difference in the output voltage level between 1 and 0 is large.

Moreover, because two kinds of value are provided as the output voltage Vz, only one kind of the threshold voltage (0.5V, for example) for distinguishing 1 and 0 of the operational result is required.

Further, the area efficiency can be improved because the number of MOS transistor is reduced by two. On the other hand, it is necessary to manage the timing of the external input.

Therefore, either the configuration shown in FIG. 3 or the configuration shown in FIG. 9 may be selected by giving the priority to either the simplification of the circuit configuration or the easiness of the control.

In each arithmetic circuit of the above-described embodiments, the action shown in each of TABLEs 1 to 4 and TABLE 17 is the non-destructive operation in which the memory data S does not change by performing the operation.

This non-destructive operation has an advantage that the reset action that rewrites the memory data is not required, whereas the operation has the volatility that the result of operation disappears when the power supply is off.

On the contrary, the action shown in each of TABLEs 5 to 16 and TABLEs 18 to 29 is the destructive operation in which the memory data S is changed by performing the operation.

This destructive operation has an inconvenience that the reset action of rewriting the memory data is required each time, whereas the operation has an advantage of non-volatility that the result of operation is preserved even if the power supply is off.

In each arithmetic circuit of the above-described embodiments, because with respect to the action for performing the operation of the input data and memory data, both the non-destructive operation and the destructive operation can be performed, the type of operation suitable for the purpose can be selected by comparing respective merits, in other words, comparing the non-destructive operation and the non-volatility.

Note that in each of the above-described embodiments, explanations are made until the point where the result of operation can be read out as the voltages Vz1, Vz2 and Vz of the terminals Z1, Z2 and Z, and a manner in which the signal is used is not particularly limited.

First, as the basic manner in which the output signal is used, the gate of the MOS transistor may be connected to the terminals Z1, Z2 and Z for outputting the result of operation, and this MOS transistor is used as the pass gate transistor that is turned on and off by the terminal voltages Vz1, Vz2 and Vz of the output terminals Z1, Z2 and Z, thereby constituting the functional pass gate in the dynamic circuit.

Further, two or more functional pass gates are connected in series or in parallel, and by adding a pre-charge transistor and evaluation transistor thereto, similarly to the functional pass gate transistor using other non-volatile device described in the Non-patent literature 1 or Non-patent literature 2, the arbitrary AND/OR operation between the results of operations of the functional pass gates is performed, and the result can be output as the voltage of the match line.

The action of this dynamic circuit is omitted because the explanation was already made.

Further, as another way of using the output signal, the input terminal of an amplifier such as a sense amplifier is connected to the terminals Z1, Z2 and Z for outputting the result of operation, and then the logic circuit of the next stage can be driven by this output.

In this case, not limited to the dynamic circuit, but a general static circuit may be combined and used.

In each of the above-described embodiments, although the case was explained in which the variable resistance elements R, 11 and 12 are configured to have a conductive film and an insulation film between two electrodes, the variable resistance element may have other configuration.

For example, the semiconductor film may be used instead of the conductive film; the semiconductor film or conductive film may be used instead of the insulation film; the laminating order may be reverse or single layer may be used. As long as the variable resistance element has the characteristic that changes between the state of high resistance and the state of low resistance by applying voltage and further has the threshold of the voltage that changes the state of resistance, any configuration can be employed.

It should be understood by those skilled in the art that various modifications, combinations, sub-combinations and alterations may occur depending on design requirements and other factors insofar as they are within the scope of the appended claims or the equivalents thereof.

What is claimed is:

1. An arithmetic circuit comprising:
  a memory element that includes a variable resistance element in which a state of resistance changes reversibly between a state of high resistance and a state of low resistance when applying voltages with different polarities between one electrode and an other electrode of the variable resistance element; and
  at least one transistor connected to each of two ends of said memory element;
  wherein, data is stored in said memory element and operations for external data input through any of said transistors are performed by applying a potential to each of the ends of said memory element through said transistor, and
  a result of said operations is output from said memory element.

2. The arithmetic circuit according to claim 1, wherein:
  said memory element is configured to have two of said variable resistance elements and three terminals in total, in which
  one terminal is a common terminal connected to said one electrode of each of two said variable resistance elements,
  a second terminal is connected to said other electrode of a first of two said variable resistance elements,
  a third terminal is connected to said other electrode of a second of two said variable resistance elements,
  at least one of said transistors is connected to the second and third terminals, and
  the result of said operations is output from said common terminal.

* * * * *